US009685230B2

(12) United States Patent
Lee et al.

(10) Patent No.: US 9,685,230 B2
(45) Date of Patent: Jun. 20, 2017

(54) SEMICONDUCTOR DEVICES INCLUDING RESISTIVE MEMORY CELLS

(71) Applicant: Samsung Electronics Co., Ltd., Suwon-si, Gyeonggi-do (KR)

(72) Inventors: Jae-kyu Lee, Seongnam-si (KR); Sung-in Kim, Hwaseong-si (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/205,498

(22) Filed: Jul. 8, 2016

(65) Prior Publication Data

US 2017/0117042 A1 Apr. 27, 2017

(30) Foreign Application Priority Data

Oct. 26, 2015 (KR) .................. 10-2015-0148828

(51) Int. Cl.
*G11C 16/26* (2006.01)
*G11C 13/00* (2006.01)

(52) U.S. Cl.
CPC ........ *G11C 13/0069* (2013.01); *G11C 13/004* (2013.01); *G11C 13/0026* (2013.01); *G11C 13/0028* (2013.01); *G11C 16/26* (2013.01)

(58) Field of Classification Search
CPC ............................ G11C 13/0069; G11C 16/26
USPC ............................................. 365/148, 189.05
See application file for complete search history.

(56) References Cited

U.S. PATENT DOCUMENTS

| 6,795,345 | B2 | 9/2004 | Ooishi |
| 8,324,698 | B2 | 12/2012 | Zhong et al. |
| 8,497,182 | B2 | 7/2013 | Lung |
| 8,614,135 | B2 | 12/2013 | Eun et al. |
| 9,299,409 | B2 * | 3/2016 | Miyakawa ............ G11C 11/161 |
| 9,299,435 | B2 * | 3/2016 | Sakimura |
| 9,344,635 | B2 * | 5/2016 | Vogelsang ........... H04N 5/3535 |
| 9,543,016 | B1 * | 1/2017 | Jin ..................... G11C 16/0408 |
| 2004/0088471 | A1 | 5/2004 | Perner et al. |
| 2009/0262568 | A1 * | 10/2009 | Ono .................... G11C 13/0011 365/148 |
| 2011/0216605 | A1 * | 9/2011 | Carman .................. G11C 7/10 365/189.02 |
| 2012/0075906 | A1 * | 3/2012 | Ho .......................... G11C 11/16 365/148 |
| 2012/0313801 | A1 * | 12/2012 | Maejima ............... H03M 1/366 341/155 |

(Continued)

FOREIGN PATENT DOCUMENTS

JP 2002-299436 A 10/2002
JP 2005-167128 A 6/2005

(Continued)

*Primary Examiner* — Michael Tran
(74) *Attorney, Agent, or Firm* — Harness, Dickey & Pierce, P.L.C.

(57) ABSTRACT

A resistive memory device resistive memory device includes a bit line configured to be driven by a bit line driver, a source line configured to be driven by a source line driver adjacent to the bit line driver, and a plurality of memory cells connected between the bit line and the source line. An electrical path of the bit line from each of the plurality of memory cells to the bit line driver increases as an electrical path of the source line from each of the plurality of memory cells to the source line driver decreases.

19 Claims, 29 Drawing Sheets

(56) References Cited

U.S. PATENT DOCUMENTS

| | | | | |
|---|---|---|---|---|
| 2013/0088911 A1* | 4/2013 | Nakura | ............. | G11C 13/0002 |
| | | | | 365/148 |
| 2013/0314969 A1* | 11/2013 | Kouno | ................... | G11O 5/063 |
| | | | | 365/65 |
| 2014/0301129 A1* | 10/2014 | Kawai | ................ | G11C 13/0069 |
| | | | | 365/148 |
| 2014/0347919 A1* | 11/2014 | Aoki | ................... | G11C 11/1653 |
| | | | | 365/158 |
| 2015/0106554 A1* | 4/2015 | Balakrishnan | ....... | G11C 7/1006 |
| | | | | 711/103 |
| 2015/0179244 A1 | 6/2015 | Seo et al. | | |

FOREIGN PATENT DOCUMENTS

| KR | 2007-0052071 A | 5/2007 |
|---|---|---|
| KR | 2012-0133679 A | 12/2012 |
| KR | 2014-0072372 A | 6/2014 |

* cited by examiner

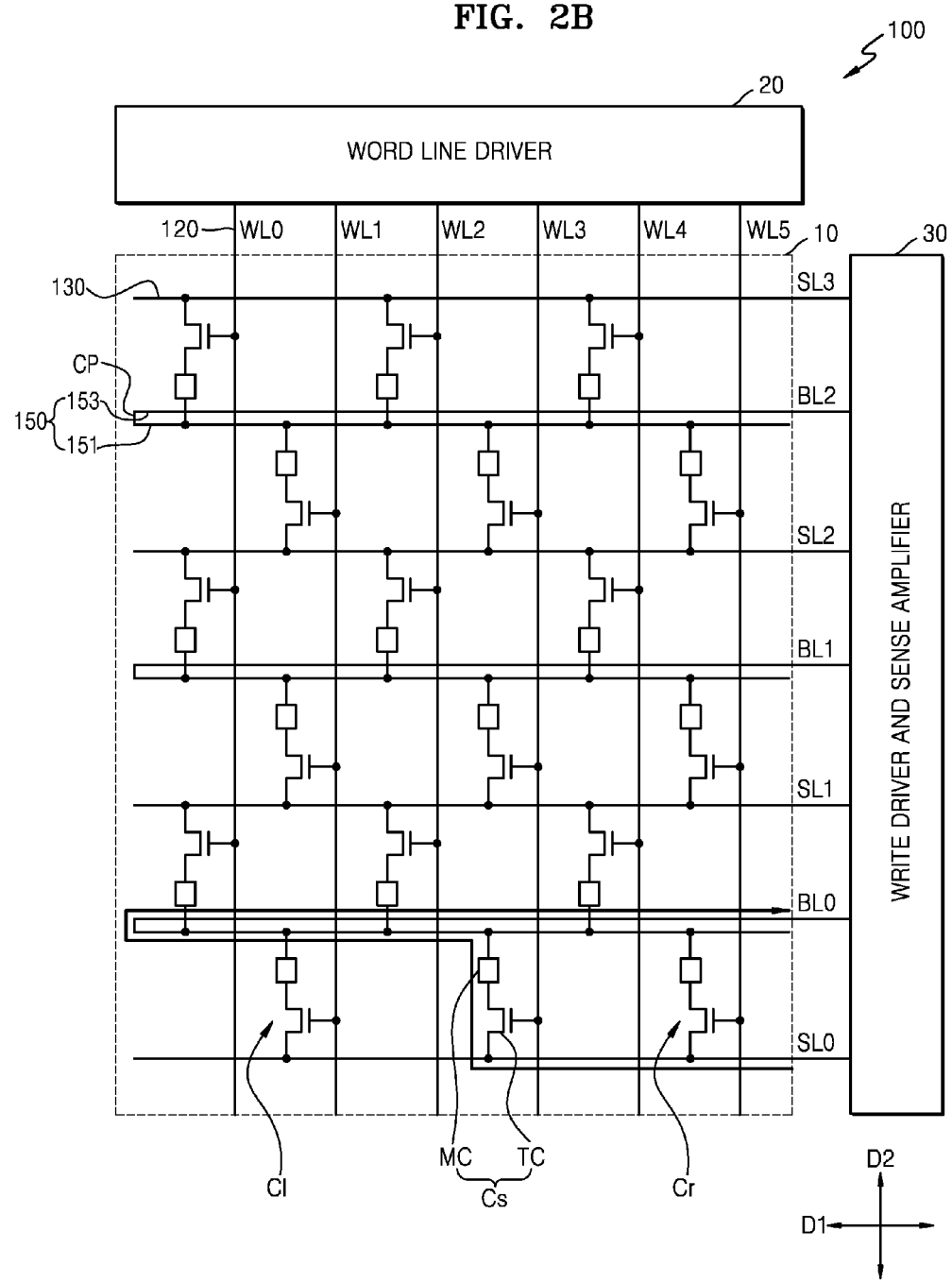

SEMICONDUCTOR DEVICES INCLUDING RESISTIVE MEMORY CELLS

CROSS-REFERENCE TO RELATED APPLICATION

This application claims priority under 35 U.S.C. §119 to Korean Patent Application No. 10-2015-0148828, filed on Oct. 26, 2015, in the Korean Intellectual Property Office, the disclosure of which is incorporated herein in its entirety by reference.

BACKGROUND

Field

One or more example embodiments relate to resistive memory devices, and more particularly, to resistive memory devices including memory cells connected between a bit line and a source line, which extend in parallel.

Description of Related Art

As semiconductor products are miniaturized, more highly integrated, and/or become more multifunctional, processing larger amounts of data in smaller areas may be needed. Accordingly, studies into devices in which pattern miniaturization for higher degree of integration is possible while increasing operating speeds of memory devices used in the semiconductor products may be required. Conventionally, however, new lithography technology and/or relatively high-priced processing technology is required for such pattern miniaturization of more highly integrated devices. Thus, studies into new technology for relatively high degree of integration are progressing. In one example, a resistive memory device such as a magnetoresistive memory device including a magnetic tunnel junction (MTJ) structure may be a next generation memory capable of providing higher speeds, lower power consumption, and/or a relatively high degree of integration.

SUMMARY

In a conventional resistive memory device, data is written by changing a resistance of a memory cell, and data is read through the resistance of the memory cell. A parasitic resistance such as a line resistance may be different according to positions of memory cells (also sometimes referred to herein as cell memories) of the resistive memory device. While a memory cell adjacent to a write driver and sense amplifier region in which a source line driver and a sense amplifier are arranged has relatively low line resistance, a memory cell located relatively far away from the region has relatively high line resistance. Accordingly, when reading the data from memory cells, a higher sensing margin is needed, and also when writing the data in the memory cell, the distribution of resistance is relatively large.

Example embodiments of inventive concepts provide resistive memory devices capable of operating at relatively low voltages while maintaining a relatively high degree of integration.

In order to achieve the object, one or more example embodiments of inventive concepts provide semiconductor devices including resistive memory cells and/or resistive memory devices as discussed herein.

At least one example embodiment provides a semiconductor device comprising: a bit line configured to be driven by a bit line driver; a source line configured to be driven by a source line driver, the source line driver adjacent to the bit line driver; and a plurality of memory cells connected between the bit line and the source line, wherein an electrical path on the bit line from each of the plurality of memory cells to the bit line driver increases as an electrical path on the source line from each of the plurality of memory cells to the source line driver decreases.

The bit line may include a first bit wiring and a second bit wiring, the plurality of memory cells may be connected to the first bit wiring, and the second bit wiring may connect the first bit wiring to the bit line driver. The plurality of memory cells may be connected to the bit line driver through the first bit wiring and the second bit wiring.

The second bit wiring may be on the first bit wiring. The second bit wiring may be connected to the first bit wiring through a contact plug.

The second bit wiring may be connected to the bit line driver at a first end of the second bit wiring. The second bit wiring may be connected to the first bit wiring at a position adjacent to a second end of the second bit wiring, and the second end may be located at an opposite side of the second bit wiring relative to the first end.

The plurality of memory cells may include a first memory cell and a second memory cell, wherein the second memory cell is located physically closer to the bit line driver and the source line driver than the first memory cell. The first memory cell may be closer to a connection point of the first bit wiring and the second bit wiring than the second memory cell.

The source line may include a source wiring connecting the plurality of memory cells with the source line driver, the source wiring having substantially the same line resistance as the first bit wiring.

A direction of a current flowing through the first bit wiring may be the same as that of a current flowing through the source wiring when (i) writing data to any memory cell among the plurality of memory cells or (ii) reading data from any memory cell among the plurality of memory cells.

The source line may include: a first source wiring to which the plurality of memory cells are connected; and a second source wiring connecting the first source wiring to the source line driver. The plurality of memory cells may be connected to the source line driver through the first source wiring and the second source wiring.

The second source wiring may be on the first source wiring and connected to the first source wiring through a contact plug.

A first end of the second source wiring may be connected to a source line driver; and the second source wiring may be connected to the first source wiring at a position adjacent to a second end of the second source wiring, the second end located at a side opposite to the first end.

The plurality of memory cells may include a first memory cell and a second memory cell. The second memory cell may be located physically closer to the bit line driver and the source line driver than the first memory cell. The first memory cell may be closer to a connection point of the first source wiring and the second source wiring than the second memory cell.

The bit line may include a bit wiring connecting the plurality of memory cells to the bit line driver, the bit wiring having substantially the same line resistance as the first source wiring.

A direction of a current flowing through the first source wiring may be the same as that of a current flowing through the bit wiring when (i) writing data to any memory cell among the plurality of memory cells or (ii) reading data from any memory cell among the plurality of memory cells.

The plurality of memory cells may include a first memory cell and a second memory cell spaced apart from each other. When an electrical path on the source line between the first memory cell and the source line driver is longer than an electrical path on the source line between the second memory cell and the source line driver, an electrical path on the bit line between the first memory cell and the bit line driver may be shorter than an electrical path on the bit line between the second memory cell and the bit line driver.

A physical distance from each of the plurality of memory cells to the bit line driver may decrease as a physical distance from each of the plurality of memory cells to the source line driver decreases.

The semiconductor device may further include: a plurality of switching devices connected between the source line and the plurality of memory cells; and a plurality of word lines configured to control the plurality of switching devices. The bit line and the source line may extend in a first direction, the plurality of word lines may extend in a second direction, and the second direction may be different from the first direction.

The semiconductor device may further include a sense amplifier adjacent to the bit line driver, the sense amplifier connected to the bit line.

Each of the plurality of memory cells may include one of: a magnetoresistive device having a magnetic tunnel junction (MTJ) structure; a phase change material layer configured to transition into a crystalline state or an amorphous state according to a current flowing between the bit line and the source line; and a variable resistance layer in which an electrical resistance varies with oxygen vacancy or oxygen movement.

At least one other example embodiment provides a semiconductor device comprising: a bit line extending in a first direction; a source line extending in the first direction; a sub-line connected to a first line, the first line being one of the bit line and the source line, the sub-line extending in the first direction; and a plurality of memory cells connected between the sub-line and a second line, the plurality of memory cells spaced apart from each other along the first direction, the second line being another of the bit line and the source line.

For a current flow from the bit line to the source line through a memory cell among the plurality of memory cells, a direction of current flowing through the sub-line may be opposite to a direction of current flowing through the first line, and a direction of the current flowing through the sub-line may be the same as a direction of a current flowing through the second line.

The first line may be on the sub-line and connected to the sub-line through a contact plug through an insulating layer insulating the sub-line from the first line.

The semiconductor device may further include: a bit line driver connected to the bit line, the bit line driver configured to drive the bit line; a source line driver connected to the source line, the source line driver configured to drive the source line; a plurality of switching devices connected between the plurality of memory cells and the source line; and a plurality of word lines extending in a second direction, the plurality of word lines configured to control the plurality of switching devices, and the second direction different from the first direction. The bit line driver and the source line driver may be at the same side of the plurality of memory cells.

Each of the plurality of memory cells may have a magnetic tunnel junction (MTJ) structure.

At least one other example embodiment provides semiconductor device comprising: a plurality of memory cells arranged in a row or column of a memory cell array; a first wiring line structure including a first wiring line and a sub line connected at a first end of the first wiring line structure, the sub line also connected to a first end of each of the plurality memory cells; a second wiring line connected to a second end of each of the plurality of memory cells; and a driver circuit connected to the first wiring line and the second wiring line at a second end of the first wiring line structure, the driver circuit configured to perform a memory operation on the plurality of memory cells. The first wiring line structure is one of a bit line and a source line, and the second wiring line is another of the bit line and the source line.

The first wiring line structure, the second wiring line, and the plurality of memory cells may be configured such that a length of an electrical path for the memory operation performed on each of the plurality of memory cells is substantially the same.

The semiconductor device may further include a plurality of word lines arranged to cross the first wiring line structure and the second wiring line, each of the plurality of word lines connected to a corresponding memory cell among the plurality of memory cells.

The plurality of memory cells may include a first memory cell and a second memory cell. A sum of an electrical path length between the driver circuit and the first memory cell through the first wiring line structure and an electrical path length between the first memory cell and the driver circuit through the second wiring line is substantially the same as a sum of an electrical path length between the driver circuit and the second memory cell through the first wiring line structure and an electrical path length between the second memory cell and the driver circuit through the second wiring line.

At least one of the plurality of memory cells may include one of: a magnetoresistive device having a magnetic tunnel junction (MTJ) structure; a phase change material layer configured to transition into a crystalline state or an amorphous state according to a current flowing through the at least one memory cell; and a variable resistance layer in which an electrical resistance varies with oxygen vacancy or oxygen movement.

BRIEF DESCRIPTION OF THE DRAWINGS

Example embodiments of inventive concepts will be more clearly understood from the following detailed description taken in conjunction with the accompanying drawings in which:

FIGS. 2A and 2B are conceptual diagrams illustrating principles of writing data "1" and "0" in the resistive memory device shown in FIG. 1;

DETAILED DESCRIPTION

Figure 1:
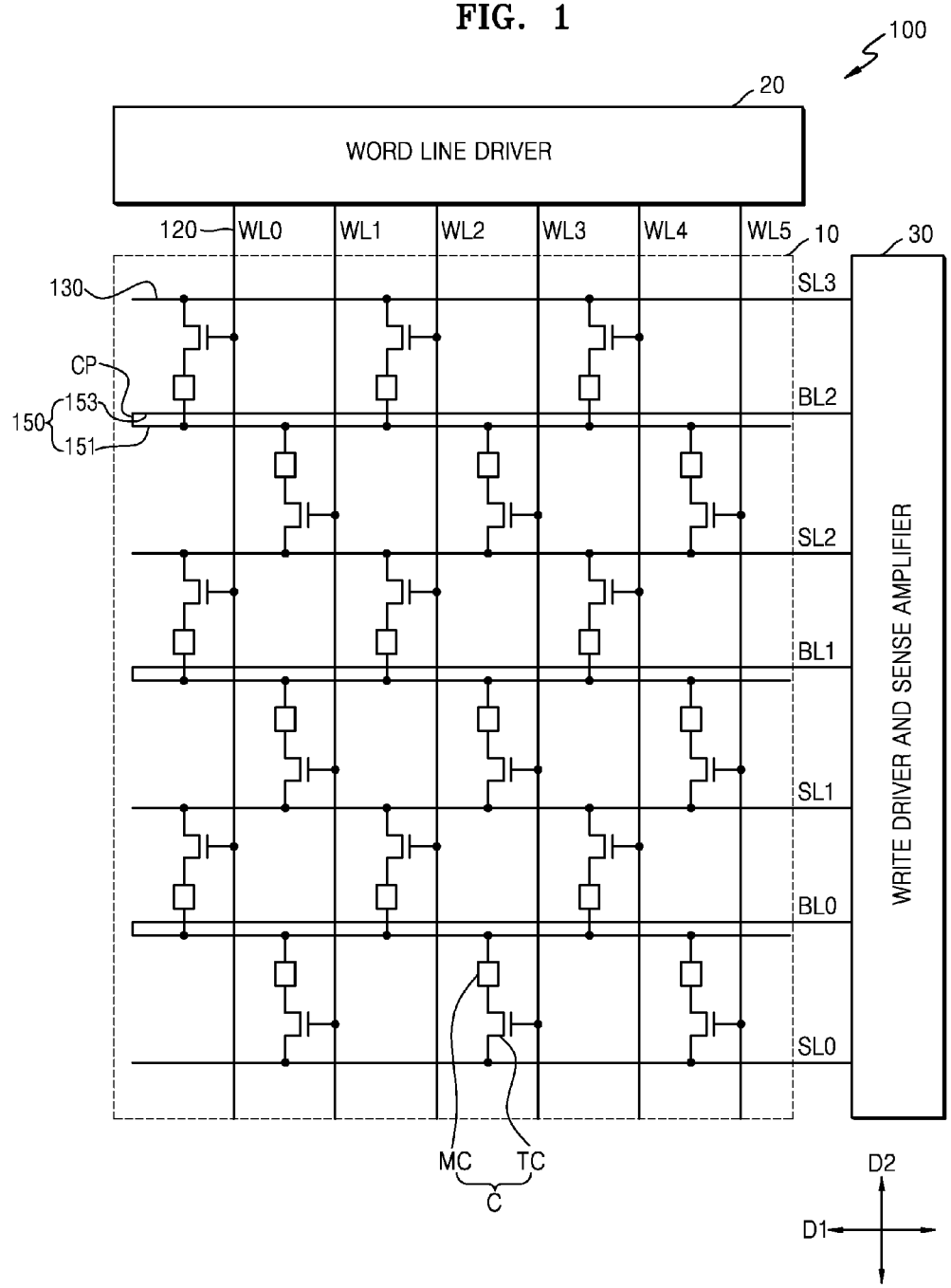
FIG. 1 is a diagram illustrating a resistive memory device according to an example embodiment of inventive concepts.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Units, controllers and/or devices (e.g., memory controller 1100, memory controller 2120, memory controller 3200, host 3300, etc. discussed in more detail below) according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units, controllers and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Example embodiments of inventive concepts explained and illustrated herein include their complementary counterparts. The same reference numerals or the same reference designators denote the same elements throughout the specification.

FIG. 1 is a diagram illustrating a resistive memory device according to an example embodiment of inventive concepts.

Referring to FIG. 1, a resistive memory device 100 may include a memory cell array 10, a word line driver region 20, and a write driver and sense amplifier region 30.

The memory cell array 10 may include a plurality of memory cells C arranged in a matrix form. Each of the memory cells C may include a cell transistor TC and a memory cell MC. The memory cell array 10 may include a plurality of word lines WL0 to WL5, 120, a plurality of source lines SL0 to SL3, 130, and a plurality of bit lines BL0 to BL2, 150. Each of the memory cells C may be electrically connected to a corresponding word line 120 among the word lines 120, a corresponding source line 130 among the source lines 130, and a corresponding bit line 150 among the bit lines 150.

The memory cell MC may include a material layer in which a resistance value varies. The memory cell MC may have a resistance value corresponding to a data value. For example, when the memory cell MC has a resistance value smaller than a given (or, alternatively, desired or predetermined) reference resistance value, the memory cell MC may write data "0." On the contrary, when the memory cell C has a resistance value greater than the given (or, alternatively, desired or predetermined) reference resistance value, the memory cell MC may write data "1." Here, the data "0" and "1" according to the resistance value are an example, and the data "0" and "1" may be reversed with each other.

The cell transistor TC may be an access transistor. The cell transistor TC may be turned on or off according to a voltage of the corresponding word line 120. When the cell transistor TC is turned on, a current may flow through the corresponding bit line 150, the memory cell MC, and the corresponding source line 130, and data may be written in the memory cell MC or read from the memory cell MC. The cell transistor TC may also be referred to as a switching device.

The word lines 120 may be arranged in parallel or substantially parallel with each other and spaced apart in a first direction D1, and each of the word lines 120 may extend along a second direction D2. Each of the word lines 120 may be driven by a word line driver in the word line driver region 20. The word line driver region 20 may be disposed in the second direction of the memory cell array 10. In order to select any one among the word lines 120, the word line driver may output a voltage for turning on the cell transistor TC to the corresponding word line 120. The second direction D2 may be a direction different from the first direction D1, for example, a direction perpendicular or substantially perpendicular to the first direction D1.

The source lines 130 may be arranged in parallel or substantially parallel with each other and spaced apart in the second direction D2, and each of the source lines 130 may extend along the first direction D1. The bit lines 150 may be arranged in parallel or substantially parallel with each other and spaced apart in the second direction D2, like the source lines 130, and each of the bit lines 150 may extend along the first direction D1.

The source lines 130 and the bit lines 150 may be connected to the write driver and sense amplifier region 30 disposed in the first direction of the memory cell array 10. A plurality of source line drivers for driving the source lines 130, respectively, and a plurality of bit line drivers for driving the bit lines 150, respectively, may be arranged in the write driver and sense amplifier region 30. Further, sense amplifiers electrically connected to the bit lines 150, respectively, may be arranged in the write driver and sense amplifier region 30.

According to at least this example embodiment of inventive concepts, each of the bit lines 150 may include a first bit wiring 151, and a second bit wiring 153 connected to the first bit wiring 151 through a contact plug CP. The memory cells MC of a corresponding row among the memory cells MC may be connected to the first bit wiring 151, and a corresponding bit line driver disposed in the write driver and sense amplifier region 30 may be connected to the second bit wiring 153. Only the second bit wiring 153 connected to the bit line driver may be referred to as the bit line, and the first bit wiring 151 may be referred to as a sub-line.

The second bit wiring 153 may have a first end and a second end. The first end may be connected to the bit line driver, and the contact plug CP may be disposed adjacent to the second end. For example, at least a greater part of the second bit wiring 153 may be connected between the contact plug CP and the bit line driver.

When a current flows from the bit line 150 to the source line 130, the current may flow from the second bit wiring 153 to the source line 130 through the first bit wiring 151 and the memory cell C. On the contrary, when the current flows from the source line 130 to the bit line 150, the current may flow from the source line 130 to the second bit wiring 153 through the memory cell C and the first bit wiring 151. That is, for example, a direction of the current flowing through the first bit wiring 151 may be the same as that of the current flowing through the source line 130, and be opposite a direction of the current flowing through the second bit wiring 153.

Since a current output from the bit line driver is applied to the memory cell C sequentially through the second bit wiring 153 and the first bit wiring 151, an electrical path of the bit line 150 from each of the memory cells MC of the corresponding row to the bit line driver may be increased as an electrical path of the source line 130 from each of the memory cells MC of the corresponding row to the source line driver is decreased. For example, a memory cell MC located on the left side in FIG. 1 may have a longer electrical path of the source line 130 to the source line driver and have a shorter electrical path of the bit line 150 to the bit line driver when compared with a memory cell MC located on the right side. For example, the memory cell MC located on the left side may have an electrical path of the bit line 150 to the bit line driver decreased as much as the electrical path of the source line 130 to the source line driver is increased when compared with the memory cell MC located on the right side. Accordingly, the sum of the length of the electrical path of the source line 130 from each of the memory cells MC to the source line driver and the length of the electrical path of the bit line 150 from each of the memory cells MC to the bit line driver may be constant or substantially constant.

According to at least one example embodiment of inventive concepts, a line resistance of the first bit wiring 151 and a line resistance of the source line 130 may be the same or substantially the same. The line resistance may refer to a resistance per a unit length, and have a unit of Ohm/m. In this case, since the electrical path of the bit line 150 to the bit line driver is increased as much as the electrical path of the source line 130 to the source line driver is decreased, the sum of an entire resistance value of the bit line 150 and an entire resistance value of the source line 130 may be constant or substantially constant when looking from each of the memory cells MC.

When the memory cells MC are connected to the second bit wiring 153 to which the bit line driver is connected and not the first bit wiring 152, the memory cell MC located on the left side in FIG. 1 may have a longer electrical path of the source line 130 to the source line driver and also have a longer electrical path of the bit line 150 to the bit line driver when compared to the memory cell MC located on the right side. Accordingly, the sum of the entire resistance value of the bit line 150 and the entire resistance value of the source line 130 when looking from the memory cell MC located on the left side may be considerably greater than that of the entire resistance value of the bit line 150 and the entire resistance value of the source line 130 when looking from the memory cell MC located on the right side.

When sensing the resistance of the memory cell MC, the entire resistance of the bit line 150 and the entire resistance of the source line 130 when looking from the memory cell MC may be sensed together with the resistance of the memory cell MC. Accordingly, even when the resistance value of the memory cell MC located on the left side is the same or substantially the same as that of the memory cell MC located on the right side, the memory cell MC located on the left side may be sensed as having a greater resistance value than the memory cell MC on the right side. Accordingly, when sensing the resistance of the memory cell MC, a margin having a relatively large width should be assigned in consideration of parasitic resistance including the resistance of the bit line 150 and the resistance of the source line 130.

According to at least this example embodiment of inventive concepts, since the sum of the entire resistance value of the bit line 150 and the entire resistance value of the source line 130 when looking from each of the memory cells MC is constant or substantially constant, the width of the margin may be decreased since it is not necessary to consider the parasitic resistance according to the bit line 150 and the source line 130 when measuring the resistance of the memory cell MC.

As shown in FIG. 1, the source lines 130 and the bit lines 150 may be alternately arranged along the second direction D2. The memory cells C included in two rows may be connected to one source line 130. In FIG. 1, the memory cells C included in a second row and the memory cells C included in a third row may be connected to a third source line SL2. Further, the memory cells C included in two rows may be connected to one bit line 150. In FIG. 1, the memory cells C included in a first row and the memory cells C included in the second row may be connected to a third bit line BL2. The memory cells C included in the second row may be connected between the third bit line BL2 and the third source line SL2. The memory cells C included in the second row may be connected to second, fourth, and sixth word lines WL1, WL3, and WL5, respectively. When one among the second, fourth, and sixth word lines WL1, WL3, and WL5 is selected, a corresponding one memory cell C among the memory cells C included in the second row may be selected.

Each of the word lines 120 may be commonly connected to gates of the cell transistors TC of the memory cells C of a corresponding column. Each of two adjacent word lines 120 may be connected to a gate of the cell transistor TC disposed in a different column in the second direction D2. For example, the second word line WL1 may be connected to gates of the cell transistors TC of the memory cells C connected between a first source line SL0 and a first bit line BL0, between a second source line SL1 and a second bit line BL1, and between the third source line SL2 and the third bit line BL2. A third word line WL2 may be connected to gates of the cell transistors TC of the memory cells C connected between the first bit line BL0 and the second source line SL1, between the second bit line BL1 and the third source line SL2, and between the third bit line BL2 and a fourth source line SL3.

The source lines 130 may be connected to sources or drains of the cell transistors TC of the memory cells C. Each of the source lines 130 may be connected to the sources or the drains of the cell transistors TC of the memory cells C, which are alternately connected to two bit lines 150 along the first direction D1. For example, the second source line SL1 may be alternately connected to the cell transistors TC of the memory cells C connected to the first bit line BL0 and the cell transistors TC of the memory cells C connected to the second bit line BL1 along the first direction D1.

The bit lines 150 may be connected to the drains or the sources of the cell transistors TC of the memory cells C. Each of the bit lines 150 may be connected to the drains or the sources of the cell transistors TC of the memory cells C, which are alternately connected to two source lines 130 along the first direction D1. For example, the first bit line BL0 may be alternately connected to the cell transistors TC of the memory cells C connected to the first source line SL0 and the cell transistors TC of the memory cells C connected to the second source line SL1 along the first direction D1. Here, the bit line 150 may be connected to the drain or the source of a corresponding cell transistor TC through the memory cell MC.

According to at least this example embodiment of inventive concepts, when any one word line and any one bit line are selected, a corresponding source line may be automatically determined. For example, when the first word line WL0 and the second bit line BL1 are selected, since the memory cell C connected to the first word line WL0 and the second bit line BL1 is connected to the third source line SL2, the third source line SL2 may be automatically determined. Further, when any one word line and any one source line are selected, a corresponding bit line may be automatically determined. For example, when the fourth word line WL3 and the third source line SL2 are selected, since the memory cell C connected to the fourth word line WL3 and the third source line SL2 is connected to the third bit line BL2, the third bit line BL2 may be determined automatically.

Meanwhile, in FIG. 1, only the first to sixth word lines WL0 to WL5, the first to fourth source lines SL0 to SL3, and the first to third bit lines BL0 to BL2 are illustrated, but that is only an example for convenience of description.

The cell transistor TC may be an access transistor. The cell transistor TC may be turned on or off according to a voltage of the corresponding word line 120, and control a current supplied to the memory cell MC. When the cell transistor TC is turned on, the current may flow through the corresponding bit line 150, the memory cell MC, and the corresponding source line 130, and data may be written in the memory cell MC or read from the memory cell MC. The cell transistor TC may be referred to as a switching device. For example, the cell transistor TC may be a metal oxide semiconductor (MOS) transistor, or a bipolar transistor.

The memory cell MC may include a material layer in which a resistance value varies. The memory cell MC may have a resistance value corresponding to a data value. For example, when the memory cell MC has a resistance value smaller than the given (or, alternatively, desired or predetermined) reference resistance value, the memory cell MC may write data "0." On the contrary, when the memory cell MC has a resistance value greater than the given (or, alternatively, desired or predetermined) reference resistance value, the memory cell MC may write data "1." Here, the data "0" and "1" according to the resistance value are an example, and the data "0" and "1" may be reversed with each other.

In an example, the memory cell MC may include a magnetic material. The memory cell MC may include a magnetoresistive device having a magnetic tunnel junction (MTJ) structure. The memory cell MC may perform a memory function using a spin transfer torque (STT) phenomenon in which a magnetization direction of the magnetic material varies with an input current. In this case, the resistive memory device 100 may be a magnetic random access memory (MRAM) device. In another example, the memory cell MC may have a phase change material layer to be changed into a crystal state or an amorphous state according to the current flowing between the bit line 150 and the source line 130. In this case, the resistive memory device 100 may be a phase change random access memory (PRAM) device. In still another example, the memory cell MC may have a variable resistance layer in which an electrical resistance varies with oxygen vacancy or oxygen movement. In this case, the resistive memory device 100 may be a resistive random access memory (ReRAM) device. Hereinafter, various example embodiments of inventive concepts will be described based on a case in which the resistive memory device 100 is an MRAM device.

A current flowing through the MTJ device should be a bidirectional current in order to write the data "0" and "1" in the MTJ device, which is a memory device included in the MRAM device. That is, for example, the current flowing through the MTJ device when writing the data "0" may have the opposite direction of the current flowing through the MTJ device when writing the data "1." In order to form a structure so that the current flows in the opposite direction, the bit line and the source line may be provided in the MRAM device. The MTJ device and the cell transistor of the memory cell may be connected between the bit line and the source line in series, and a potential difference between the bit line and the source line may be changed to select the direction of the current flowing through the MTJ device of the memory cell.

A circuit diagram of the memory cell array according to an example embodiment of inventive concepts is illustrated in FIG. 1, but it is only an example, and inventive concepts should not limited to the circuit diagram shown in FIG. 1.

Figure 2A:
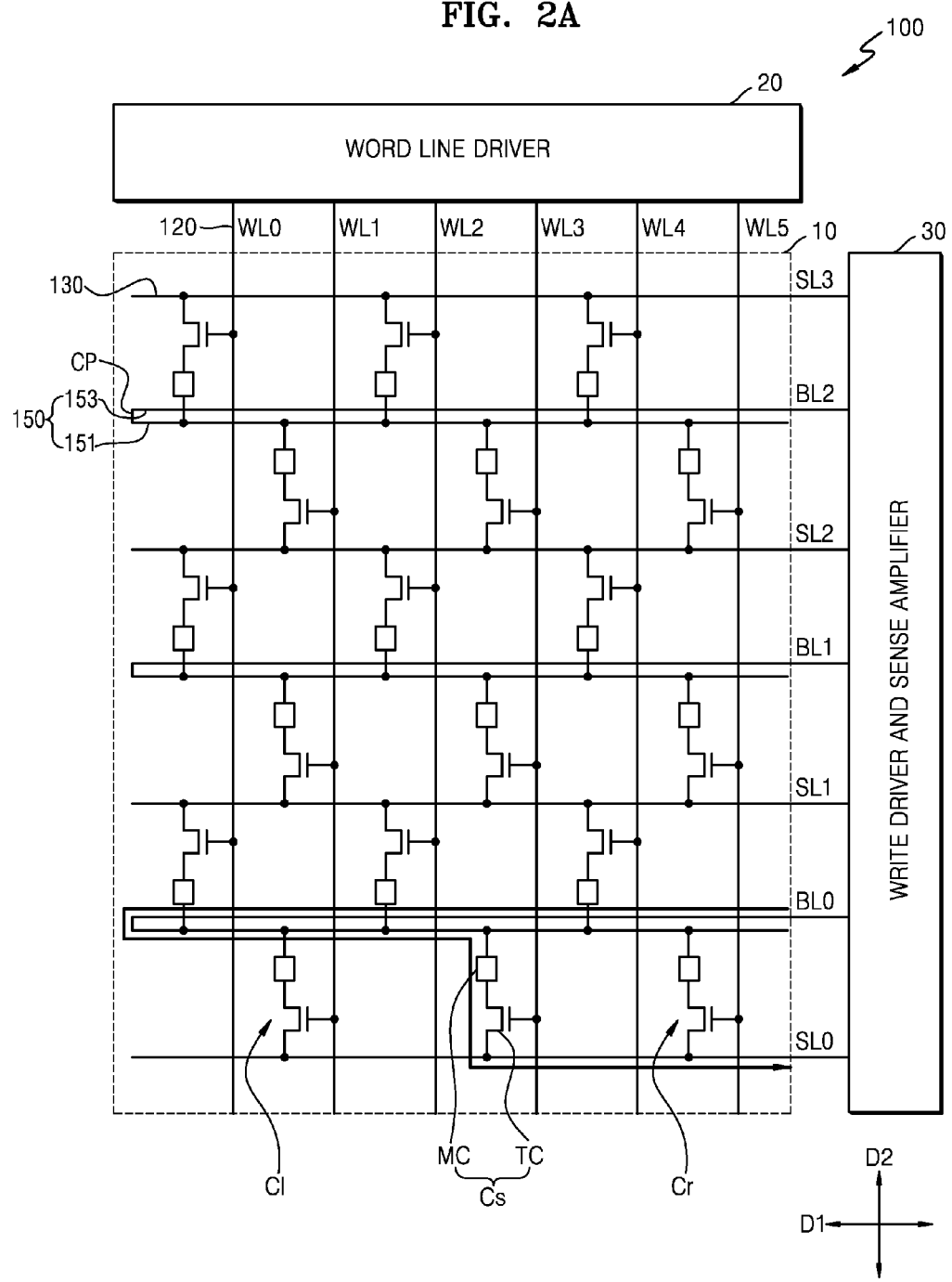

FIGS. 2A and 2B are conceptual diagrams illustrating example principles of writing data "1" and "0" in the resistive memory device shown in FIG. 1

Referring to FIG. 2A, when writing the data "1" in a selected memory cell Cs, the fourth word line WL3 and the first bit line BL0 (or, the first source line SL0) are selected, and the selected memory cell Cs may be determined uniquely.

When a suitable turn-on voltage is applied to the fourth word line WL3, a high voltage is applied to the first bit line BL0, and a low voltage is applied to the first source line SL0, a current path shown as an arrow may be generated, and the data "1" may be written in the memory cell MC of the selected memory cell Cs. Here, for example, the high voltage applied to the first bit line BL0 may be about 1.2 V, and the low voltage applied to the first source line SL0 may be about 0 V. However, the values of the high voltage and the low voltage are only examples, and the values of the high voltage applied to the first bit line BL0 and the low voltage applied to the first source line SL0 are not limited thereto.

Referring to FIG. 2B, when writing the data "0" in the selected memory cell Cs, in the same manner, the fourth word line WL3 and the first bit line BL0 (or the first source line SL0) are selected, and the selected memory cell Cs may be determined uniquely.

When the suitable turn-on voltage is applied to the fourth word line WL3, the low voltage is applied to the first bit line BL0, and the high voltage is applied to the first source line SL0, a current path shown as an arrow may be generated, and the data "0" may be written in the memory cell MC of the selected memory cell Cs. Here, for example, the low voltage applied to the first bit line BL0 may be about 0 V, and the high voltage applied to the first source line SL0 may be about 1.2 V. However, the values of the high voltage and the low voltage may be only examples, and the values of the low voltage applied to the first bit line BL0 and the high voltage applied to the first source line SL0 are not limited thereto. The data "0" may be written by changing the voltages applied to the first bit line BL0 and the first source line SL0, respectively, in order to write the data "1." Accordingly, according to at least this example embodiment of inventive concepts, the data may be written in the memory cell MC using a low operating voltage of about 1.2 V.

In FIG. 2A, the current flow for writing the data "1" in the selected memory cell Cs is illustrated, and in FIG. 2B, the current flow for writing the data "0" in the selected memory cell Cs is illustrated, but they are examples, the data "0" may be written in the selected memory cell Cs by the current flow shown in FIG. 2A, and the data "1" may be written in the selected memory cell Cs by the current flow shown in FIG. 2B.

Referring to FIG. 2A again, a first memory cell Cl located at the left side of the selected memory cell Cs and a second memory cell Cr located at the right side of the selected memory cell Cs are illustrated. In order to write the data "1" in the first memory cell Cl, the second word line WL1 may be selected instead of the fourth word line WL3. In this case, a current path passing through the first memory cell Cl may be formed instead of the current path passing through the selected memory cell Cs. In order to write the data "1" in the second memory cell Cr, the sixth word line WL5 may be selected instead of the fourth word line WL3. In this case, a current path passing through the second memory cells Cr may be formed instead of the current path passing through the selected memory cell Cs. As shown in FIG. 2A, a length of the current path passing through the first memory cell Cl may be the same or substantially the same as that of the current path passing through the second memory cell Cr. Accordingly, the sum of the resistance of the first bit line BL0 and the resistance of the first source line SL0 in the current path passing through the first memory cell C1 may be the same or substantially the same as that of the resistance of the first bit line BL0 and the resistance of the first source line SL0 in the current path passing through the memory cell Cr.

Figure 3:
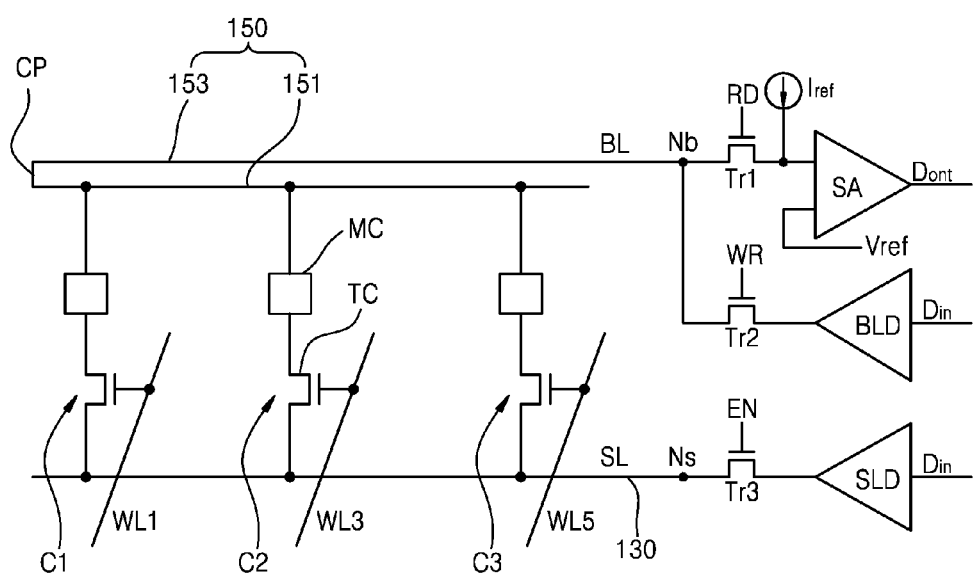
FIG. 3 is a diagram illustrating example memory cells included in one row in the resistive memory device shown in FIG. 1.

FIG. 3 is a diagram illustrating example memory cells included in a row in the resistive memory device shown in FIG. 1.

Referring to FIG. 3, a plurality of memory cells C1, C2, and C3 connected between one bit line BL and one source line SL are illustrated. The cell transistors TC of the memory cells C1, C2, and C3 may be connected to the second, fourth, and sixth word lines WL1, WL3, and WL5, respectively.

The bit line BL may include a first bit wiring 151 connected to the memory cells C1, C2, and C3, and a second bit wiring 153 connected to the first bit wiring 151 through a contact plug CP. The second bit wiring 153 may be connected to a bit line driver BLD and a sense amplifier SA through a first node Nb.

The source line SL may include a source wiring 130 connected to the memory cells C1, C2, and C3. The source wiring 130 may be connected to a source line driver SLD through a second node Ns.

The bit line driver BLD, the sense amplifier SA, and the source line driver SLD may be arranged in the write driver and sense amplifier region 30 shown in FIG. 1. For example, a circuit located on the right side of the first node Nb and the second node Ns may be arranged in the write driver and sense amplifier region 30. A portion of the left side of the first node Nb and the second node Ns may correspond to the memory cell array 10.

A transistor Tr1 controlled by a write signal WR may be connected between the first node Nb of the bit line BL and the bit line driver BLD. The write signal WR may have a turn-on level when writing data in any one among the memory cells C1, C2, and C3.

A transistor Tr2 controlled by a read signal RD may be connected between the first node Nb of the bit line BL and the sense amplifier SA. The read signal may have a turn-on level when reading data from any one among the memory cells C1, C2, and C3.

A transistor Tr3 controlled by an enable signal EN may be connected between the second node Ns of the source line SL and the source line driver SLD. The enable signal EN may have a turn-on level when any one of the write signal WR and the read signal RD has the turn-on level.

Input data Din may be applied to an input terminal of the bit line driver BLD. Inverted input data Din' may be input to an input terminal of the source line driver SLD. For example, when the input data Din is "1," the bit line driver BLD may output the high voltage, and when the input data Din is "0," the bit line driver BLD may output the low voltage. On the contrary, when the input data Din is "1," the source line driver SLD may output the low voltage, and when the input data Din is "0," the source line driver SLD may output the high voltage. In this case, the high voltage may be about 1.2 V, and the low voltage may be about 0 V. However, the values of the high voltage and the low voltage may be only an example, and the values are not limited thereto.

A reference voltage Vref and the bit line BL may be connected to an input terminal of the sense amplifier SA. When a voltage of the bit line BL is higher than the reference voltage Vref, the sense amplifier SA may output "1" as output data Dout, and when the voltage of the bit line BL is lower than the reference voltage Vref, the sense amplifier SA may output "0" as the output data Dout. This is an example, and on the contrary, when the voltage of the bit line BL is higher than the reference voltage Vref, the sense amplifier SA may output "0," and when the voltage of the bit line BL is lower than the reference voltage Vref, the sense amplifier SA may output "1."

A reference current Iref may be applied to the bit line BL. The reference current Iref may be applied to the bit line BL when the read signal RD has the turn-on level. The reference current Iref may flow through the current path passing through a selected memory cell C, and a voltage of the bit line BL at the input terminal of the sense amplifier SA may be determined as a value obtained by adding a voltage of the source line SL and a value obtained by multiplying an entire resistance on the current path and the reference current Tref. For example, when the resistance of the memory cell MC of the selected memory cell C is high, the voltage of the bit line BL may be higher than the reference voltage Vref, and when the resistance of the memory cell MC of the selected memory cell C is low, the voltage of the bit line BL may be lower than the reference voltage Vref.

The entire resistance on the current path may include the resistance of the memory cell MC of the selected memory cell C and a parasitic resistance around the selected memory cell C. The parasitic resistance may include a resistance of the bit line BL between the selected memory cell C and the sense amplifier SA, a resistance of the source line SL between the selected memory cell C and the source line driver SLD, a contact resistance, and a turn-on resistance of transistors. When the lengths of the bit line BL and the source line SL on the current path are changed according to a position of the selected memory cell C, the resistance of the bit line BL and the resistance of the source line SL may be changed according to the position of the selected memory cell C. For example, when the bit line BL is formed as one wiring, that is, when the memory cells C are connected to the second bit wiring 153 without the first bit wiring 151, the resistance of the bit line BL and the resistance of the source line SL may be decreased when the selected memory cell C is adjacent to the write driver and sense amplifier region 30, but the resistance of the bit line BL and the resistance of the source line SL may be increased as the selected memory cell C moves away from the write driver and sense amplifier region 30.

As described above, a voltage by the resistance of the bit line BL and the source line SL on the current path in addition to a voltage by the resistance of the memory cell MC of the selected memory cell C may appear as the voltage of the bit line BL at the input terminal of the sense amplifier SA. Accordingly, even when the resistance of the memory cell MC of the selected memory cell C is low, since the resistance of the bit line BL and the source line SL on the current path is high when the length of the current path is relatively large, the voltage of the bit line BL may be higher than the reference voltage Vref.

However, according to at least this example embodiment of inventive concepts, since the resistance of the bit line BL and the source line SL on the current path is the same or substantially the same in all of the memory cells C1, C2, and C3, the voltage of the bit line BL sensed by the sense amplifier SA may be proportional or substantially proportional to the resistance of the memory cell MC regardless of the position of the memory cell C. Accordingly, even when the resistance of the memory cell MC of the selected memory cell C is low due to the parasitic resistance of the bit line BL and the source line SL, a problem in which the voltage of the bit line BL sensed by the sense amplifier SA becomes higher than the reference voltage Vref may be suppressed and/or prevented. Further, in order to solve the problem, it may not be necessary to set a margin having a relatively large width. The operating voltage may be decreased since the width of the margin is decreased.

Figure 4:
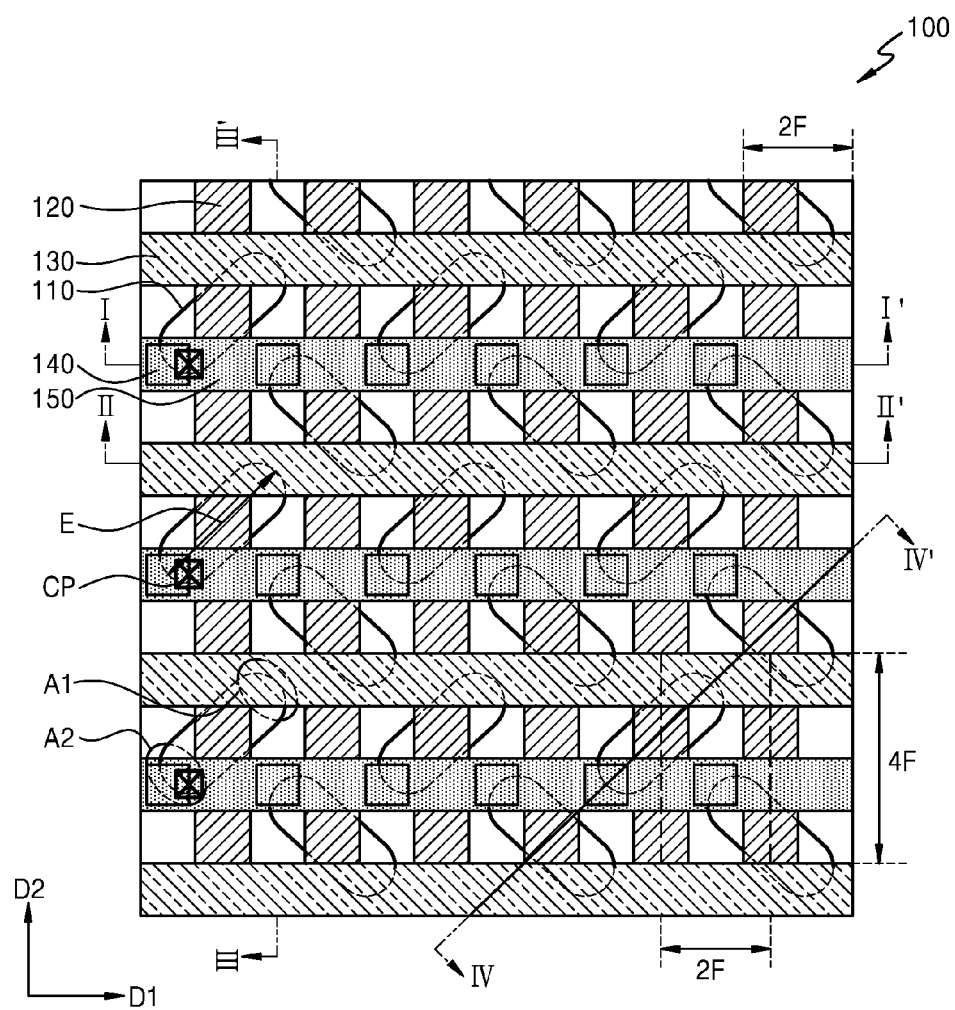
FIG. 4 is a diagram illustrating an example layout of a resistive memory device according to an example embodiment of inventive concepts.

FIG. 4 is a diagram illustrating an example layout of a resistive memory device according to an example embodiment of inventive concepts. The layout shown in FIG. 4 may correspond to the memory cell array of the resistive memory device shown in FIG. 1.

Referring to FIG. 4, the resistive memory device 100 may include a plurality of memory cells C (see FIG. 1) arranged in a matrix form. The resistive memory device 100 may include an active region 110, word lines 120, source lines 130, a variable resistance structure 140, and bit lines 150.

The active region 110 may be defined on a substrate (not shown) by an isolation film (not shown). For example, the active region 110 may extend in an extension direction E as shown by a double-headed arrow, and be arranged at an angle oblique to a first direction D1. For example, the active region 110 may be arranged to have a first angle θ corresponding to an angle acute to the first direction D1. For example, the first angle θ may be about 45 degrees. Further, the active region 110 may be arranged at an angle oblique to a second direction D2.

The active region 110 may have a first region A1 and a second region A2. The first region A1 may be a region connected to the source line 130 and at least partially overlap the source line 130. The first region A1 may be a source or drain region of a transistor. The second region A2 may be connected to the bit line 150 and at least partially overlap the second region A2. The second region A2 may be a drain or source region of the transistor. Meanwhile, the second region A2 of the active region 110 may be connected to the bit line 150 through the variable resistance structure 140.

The active regions 110 may be arranged in parallel or substantially parallel to each other along the first direction D1 and the second direction D2 as shown. Further, the extension direction E of first active regions 110 arranged along any one word line extending along the second direction D2 may be different from the extension direction E of second active regions 110 arranged along a word line 120 adjacent to the any one word line. For example, the extension direction E of the first active regions 110 may be perpendicular or substantially perpendicular to the extension direction E of the second active regions 110. In FIG. 4, the first active regions 110 may be located below the source line 130 and above the bit line 150. Further, in FIG. 4, the second active regions 110 may be located below the bit line 150 and above the source line 130.

The active region 110 may be formed as a semiconductor material layer forming a substrate, or a semiconductor material layer separately formed on the substrate. For example, the active region 110 may be formed as a silicon layer formed on the substrate by deposition or epitaxial growth. For example, the silicon layer may be a single crystalline silicon layer or a poly silicon layer.

The word lines 120 may be arranged in parallel or substantially parallel with each other and spaced apart in the first direction D1 while extending along the second direction D2. Each of the word lines 120 may be arranged to intersect the active regions 110 arranged along the second direction D2. For example, each of the word lines 120 may be arranged to intersect between the first region A1 and the second region A2 of each of the active regions 110 arranged along the second direction D2.

The word line 120 may include at least one material among a doped semiconductor, a metal, a conductive metal nitride, and a metal-semiconductor compound. Meanwhile, the width of the word line 120 may be about 1 F, and a pitch between the word lines 120 in the first direction D1 may be about 2 F. Here, F refers a minimum lithographic feature size.

The source lines 130 may be arranged in parallel or substantially parallel with each other and spaced apart in the second direction D2 while extending along the first direction D1. Each of the source lines 130 may be electrically connected to the first region A1 of each of the active regions 110, and be arranged to overlap a portion of the first region A1. For example, in FIG. 4, the first regions A1 of the first active regions 110 arranged between each of the source lines 130 and the bit line 150 downwardly adjacent to each of the source lines 130 and the first regions A1 of the second active regions 110 arranged between each of the source lines 130 and the bit line 150 upwardly adjacent to each of the source lines 130 may be connected to each of the source lines 130. The first region A1 of each of the first active regions 110 and the first region A1 of each of the second active regions 110 may be commonly and electrically connected to one source line 130.

The source line 130 may include at least one material among a metal, a conductive metal nitride, a metal-semiconductor compound, and a doped semiconductor. Meanwhile, the width of the source line 130 may be about 1 F, and a pitch between the source lines 130 in the second direction D2 may be about 4 F.

The variable resistance structures 140 may be arranged along the first direction D1 and the second direction D2 so as to correspond to the second region A2 of the active region 110. The variable resistance structures 140 may be arranged between the bit line 150 and the second region A2 of the active region 110, and be connected to the second region A2 of the active region 110 as well as the bit line 150. The variable resistance structure 140 will be described in more detail below.

The bit lines 150 may be arranged in parallel or substantially parallel with each other and spaced apart in the second direction D2 while extending along the first direction D1, like the source lines 130. The bit lines 150 and the source lines 130 may be alternately arranged with each other along the second direction D2. Each of the bit lines 150 may be electrically connected to the second region A2 of each of the active regions 110, and be arranged to overlap a portion of the second region A2. Each of the bit lines 150 may be electrically connected to the second region A2 of the active regions 110 through the variable resistance structure 140.

In FIG. 4, the second regions A2 of the second active regions 110 arranged between each of the bit lines 150 and the source line 130 downwardly adjacent to each of the bit lines 150 and the second regions A2 of the first active regions 110 arranged between each of the bit lines 150 and the source line 130 upwardly adjacent to each of the bit lines 150 may be connected to each of the bit lines 150. The second region A2 of each of the first active regions 110 and the second region A2 of each of the second active regions 110 may be commonly and electrically connected to one bit line 150.

The bit line 150 may include at least one material among a metal, a conductive metal nitride, a metal-semiconductor compound, and a doped semiconductor. Meanwhile, the width of the bit line 150 may be about 1 F, and a pitch between the bit lines 150 in the second direction D2 may be about 4 F.

Although not shown in FIG. 4, the bit line 150 may include the first bit wiring 151 and the second bit wiring 153. The second bit wiring 151 may be electrically connected to the first bit wiring 151 through a contact plug CP. Each of the first bit wirings 151 may be electrically connected to the variable resistance structures 140 arranged in the same row.

Meanwhile, a square shown as a dotted line may refer to a unit memory cell Cu. The unit memory cell Cu may have a size of about 8 $F^2$.

FIGS. 5A to 5D are cross-sectional views taken along lines I-I', II-II', III-III', and IV-IV' shown in FIG. 4, respectively.

Referring to FIGS. 5A to 5D, the resistive memory device 100 may include a substrate 101 in which an isolation film 103 is formed. The active regions 110 extending in parallel or substantially parallel with each other at an angle oblique to the first direction (an X direction) on the substrate 101 may be defined by the isolation film 103 (see FIG. 4). The isolation film 103 may be formed in an isolation trench T1 formed in the substrate 101.

The substrate 101 may be formed of a semiconductor material. In at least some example embodiments, the substrate 101 may include silicon (Si). In at least one other example embodiments, the substrate 101 may include a semiconductor material such as germanium (Ge), or a compound semiconductor material such as silicon carbide (SiC), gallium arsenide (GaAs), indium arsenide (InAs), and indium phosphorus (InP). In at least some other example embodiments, the substrate 101 may have a silicon on insulator (SOI) structure. For example, the substrate 101 may include a buried oxide (BOX) layer. In at least some example embodiments, the substrate 101 may include a conductive region, for example, a well doped with impurities, or a structure doped with the impurities.

The word lines 120 may extend along the second direction D2 on the active regions 110. The word lines 120 may be arranged in parallel or substantially parallel with each other to have a given (or, alternatively, desired or predetermined) gap, for example, the pitch of about 2 F, along the first direction D1.

The word lines 120 may have a buried word line structure buried in the substrate 101 to have an upper surface of a level lower than that of an upper surface 101T of the substrate 101. However, example embodiments of inventive concepts are not limited thereto. For example, the word lines 120 may be formed to have an upper surface of a level higher than the upper surface 101T of the substrate 101.

The word lines 120 may be formed in a gate trench T2 formed in the substrate 101. A gate dielectric film 122 insulating the plurality of word lines 120 from the substrate 101 may be formed in the gate trench T2. A buried insulating film 125 may be filled on the word lines 120 in the gate trench T2. In at least some example embodiments, the word line 120 may include at least one material among a doped semiconductor, a metal, a conductive metal nitride, and a metal-semiconductor compound.

In at least some example embodiments, the gate dielectric film 122 may be formed as at least one selected among a silicon oxide film, a silicon nitride film, a silicon oxynitride film, an oxide/nitride/oxide (ONO), and a high-k dielectric film having a dielectric constant greater than the silicon oxide film.

In at least some example embodiments, the buried insulating film 125 may include at least one among a silicon nitride film, a silicon oxide film, and a silicon oxynitride film.

The source lines 130 may be formed on the upper surface 101T of the substrate 101 and on the isolation film 103. The source lines 130 may be electrically connected to the first region A1 of the active region 110 by being in contact with the first region A1 (see FIG. 4) of the active region 110. The source lines 130 may be arranged in parallel or substantially parallel with each other and spaced apart in the second direction D2 while extending along the first direction D1 (see FIG. 4).

A metal silicide film (not shown) may be formed between the source lines 130 and the active region 110. The metal silicide film may perform a function of decreasing a contact resistance between a source/drain region formed in the active region 110, for example, the first region A1 (see FIG. 4) of the active region 110, and the source line 130. However, the metal silicide film may be omitted, and as shown, the source lines 130 may be in contact (e.g., direct contact) with the first region A1 of the active region 110.

In at least some example embodiments, the source lines 130 may be formed to have a buried structure at a level lower than that of the upper surface 101T of the substrate 101. Even when the source lines 130 are formed to have the buried structure, the source lines 130 may be formed at a higher position than the upper surfaces of the word lines 120 since the source lines 130 intersect the word lines 120.

A first insulating layer 161 covering the source lines 130 may be formed on the upper surface 101T of the substrate 101 and on the isolation film 103. The first insulating layer 161 may be formed as an oxide film, a nitride film or a combination thereof. The first insulating layer 161 having a single layer structure is illustrated, but it is not limited thereto, and the first insulating layer 161 may have a multi-layer structure formed of the same material, substantially the same material or different materials.

First contact plugs 170, which are in contact with the second regions A2 (see FIG. 4) of the active regions 110 by penetrating through the first insulating layer 161, may be formed on the upper surface 101T of the substrate 101 and on the isolation film 103. The first contact plugs 170 may have a cylindrical structure. However, the structure of the first contact plug 170 is not limited to the cylindrical structure. For example, the first contact plug 170 may be formed to have forms of various polygonal pillars, such as a square pillar, a pentagonal pillar, etc., or an elliptical pillar. Further, the first contact plug 170 may become gradually thinner toward a lower portion, and have a structure in which an upper portion has a greater diameter than a lower portion.

The metal silicide film (not shown) may be formed between the first contact plug 170 and the second region A2 of the active region 110. The metal silicide film may perform a function of decreasing contact resistance between the second regions A2 of the active regions 110, for example, the source/drain regions of a plurality of active regions 110, and the first contact plugs 170. However, the metal silicide film may be omitted, and as shown, the plurality of first contact plugs 170 may be in contact (e.g., direct contact) with the second regions A2 of the active regions 110.

The variable resistance structures 140 may be arranged on the first contact plugs 170, respectively. The variable resistance structures 140 may be electrically insulated from each other by a second insulating layer 163. The second insulating layer 163 may be formed as an oxide film, a nitride film, or a combination thereof. The second insulating layer 163 having a single layer structure is illustrated, but it is not limited thereto, and the second insulating layer 163 may be formed to have a multi-layer structure formed of the same material, substantially the same material, or different materials. Each of the variable resistance structures 140 may be connected to the second region A2 of a corresponding active region 110 through a corresponding first contact plug 170.

Each of the variable resistance structures 140 may write data according to a resistive state. Each of the variable resistance structures 140 may have the MTJ structure. For example, each of the variable resistance structures 140 may include a lower electrode 142, an upper electrode 146, and a variable resistance layer 144 disposed between the lower electrode 142 and the upper electrode 146. For example, the variable resistance layer 144 may include a first magnetization layer, a tunnel barrier layer, and a second magnetization layer, which are sequentially stacked. The variable resistance structure 140 will be described in more detail below.

The bit lines 150 may be formed on the variable resistance structures 140. The bit lines 150 may be arranged in parallel or substantially parallel with each other in the second direction D2 while extending along the first direction D1. The bit lines 150 may be electrically insulated from each other by a third insulating layer 165. The third insulating layer 165 may be formed as an oxide film, a nitride film, or a combination thereof. The third insulating layer 165 having a single layer structure is illustrated, but it is not limited thereto, and the third insulating layer 165 may be formed to have a multi-layer structure formed of the same material, substantially the same material, or different materials.

Each of the bit lines 150 may be electrically connected to a corresponding variable resistance structure 140 through a second contact plug 155. The bit lines 150 may be electrically connected to the second region A2 of the active region 110 through the second contact plug 155, the variable resistance structure 140, and the first contact plug 170.

In at least some example embodiments, the bit lines 150 may include at least one material among a metal, a conductive metal nitride, a metal-semiconductor compound, and a doped semiconductor. For example, the bit lines 150 may include a barrier film formed of tantalum (Ta), titanium (Ti), tantalum nitride (TaN), titanium nitride (TiN), or a combination thereof, and a metal film formed on the barrier film, for example, a copper (Cu) film.

Each of the bit lines 150 may include a second bit wiring 153 connected to the first bit wiring 151 through the first bit wiring 151 and a third contact plug CP. The second bit wiring 153 may be isolated from the first bit wiring 151 by a fourth insulating layer 167. The third contact plug CP may connect the first bit wiring 151 and the second bit wiring 153 by penetrating through the fourth insulating layer 167. The fourth insulating layer 167 may be formed as an oxide film, a nitride film, or a combination thereof. The fourth insulating layer 167 having a single layer structure is illustrated, but it is not limited thereto, and the fourth insulating layer 167 may have a multi-layer structure formed of the same material, substantially the same material, or different materials. The second bit wiring 153 may be disposed on the first bit wiring 151, and be connected to the first bit wiring 151 through the third contact plug CP.

Each of the first bit wirings 151 may be in contact with upper surfaces of corresponding contact plugs 155. The third contact plug CP may be disposed adjacent to an end of the second bit wiring 153, and electrically connect an end of the first bit wiring 151 and the end of the second bit wiring 153.

A cross section of the bit lines 150 shown in FIG. 5C will be described in more detail with reference to FIG. 9.

Figure 6:
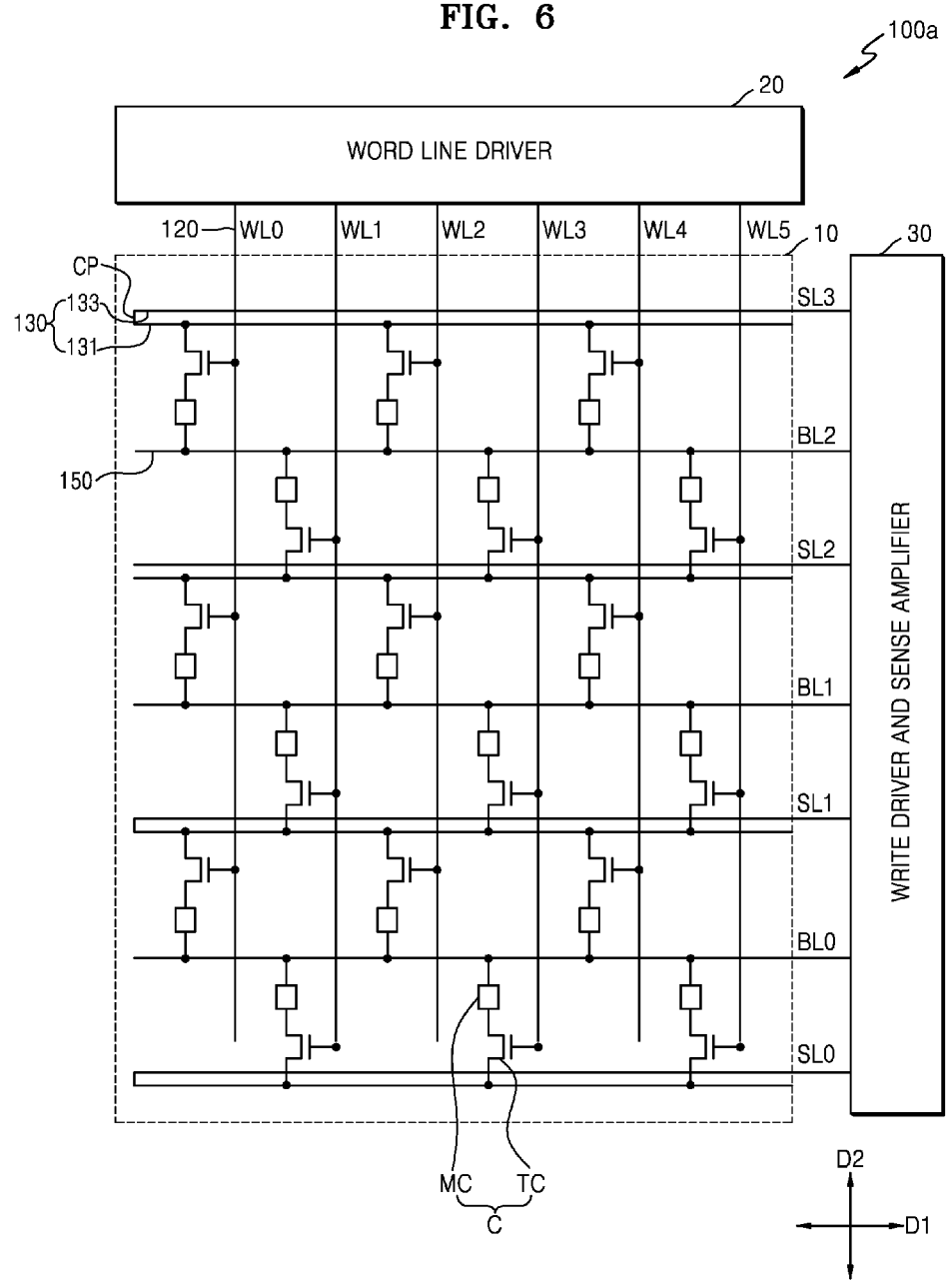
FIG. 6 is a diagram illustrating a resistive memory device according to another example embodiment of inventive concepts.

FIG. 6 is a diagram illustrating a resistive memory device according to another example embodiment of inventive concepts.

Referring to FIG. 6, a resistive memory device 100a may include a memory cell array 10, a word line driver region 20, and a write driver and sense amplifier region 30. The resistive memory device 100a may be substantially the same as the resistive memory device 100 shown in FIG. 1, excluding the source line 130 and the bit line 150, and description regarding the same components will be omitted.

The memory cell array 10 may include memory cells C arranged in a matrix form. Each of the memory cells C may include a cell transistor TC and a memory cell MC. The memory cell array 10 may include a plurality of word lines WL0 to WL5, 120, a plurality of source lines SL0 to SL3, 130, and a plurality of bit lines BL0 to BL2, 150. Each of the memory cells C may be electrically connected to a corresponding word line 120, a corresponding source line 130, and a corresponding bit line 150.

The memory cell MC may include a material layer in which a resistance value varies. The memory cell MC may have a resistance value corresponding to a data value. The cell transistor TC may be turned on or off according to a voltage of the corresponding word line 120. When the cell transistor TC is turned on, a current may flow through the corresponding bit line 150, the memory cell MC, and the corresponding source line 130, and data may be written in the memory cell MC or read from the memory cell MC.

The word lines 120 may be arranged in parallel or substantially parallel with each other and spaced apart in a first direction D1, and each of the word lines 120 may extend along a second direction D2. Each of the word lines 120 may be driven by a word line driver in the word line driver region 20.

The source lines 130 may be arranged in parallel or substantially parallel with each other and spaced apart in the second direction D2, and each of the source lines 130 may extend along the first direction D1. Like the source lines 130, the bit lines 150 may be arranged in parallel or substantially parallel with each other and spaced apart in the second direction D2, and each of the bit lines 150 may extend along the first direction D1, The source lines 130 and the bit lines 150 may be connected to the write driver and sense amplifier region 30 disposed in a first direction of the memory cell array 10. A plurality of source line drivers for driving the source lines 130, respectively, and a plurality of bit line drivers for driving the bit lines 150, respectively, may be arranged in the write driver and sense amplifier region 30. Further, sense amplifiers, which are electrically connected to the bit lines 150, respectively, may be arranged in the write driver and sense amplifier region 30.

According to an example embodiment of inventive concepts, each of the source lines 130 may include a first source wiring 131 and a second source wiring 133 connected to the first source wiring 131 through a contact plug CP. The memory cells MC arranged in a corresponding row among the memory cells MC may be connected to the first source wiring 131, and the second source wiring 133 may be connected to a corresponding source line driver disposed in the write driver and sense amplifier region 30. Only the second source wiring 133 connected to the source line driver may be referred to as a source line, and the first source wiring 131 may also be referred to as a sub-line.

The second source wiring 133 may have a first end and a second end. The source line driver may be connected to the first end, and the contact plug CP may be disposed adjacent to the second end. For example, at least a greater part of the second source wiring 133 may be connected between the contact plug CP and the source line driver.

When a current flows from the bit line 150 to the source line 130, the current may flow from the bit line 150 to the first source wiring 131 and the second source wiring 133 through the memory cell C. On the contrary, when a current flows from the source line 130 to the bit line 150, the current may flow from the second source wiring 133 to the bit line 150 through the first source wiring 131 and the memory cell C. That is, for example, a direction of the current flowing through the bit line 150 may be the same as that of the current flowing through the first source wiring 131, and be opposite that of the current flowing through the second source wiring 133.

Since the current output from the bit line driver sequentially flows through the first source wiring 131 and the second source wiring 133 after reaching the memory cell C through the bit line 150, an electrical path of the source line 130 from each of the memory cells MC arranged in the corresponding row to the source line driver may be increased as an electrical path of the bit line 150 from each of the memory cells MC arranged in the corresponding row to the bit line driver is decreased. For example, a memory cell MC located on the left side in FIG. 6 may have a longer electrical path of the bit line 150 to the bit line driver and have a shorter electrical path of the source line 130 to the source line driver, when compared with a memory cell MC located on the right side. For example, the memory cell MC located on the left side may have an electrical path of the source line 130 to the source line driver decreased as much as the electrical path of the bit line 150 to the bit line driver is increased, when compared with the memory cell MC located on the right side. Accordingly, the sum of the length of the electrical path of the source line 130 from each of the memory cells MC to the source line driver and the length of the electrical path of the bit line 150 from each of the memory cells MC to the bit line driver may be constant or substantially constant.

According to at least one example embodiment of inventive concepts, a line resistance of the first source wiring 131 and a line resistance of the bit line 150 may be the same or substantially the same. The line resistance may refer to a resistance per a unit length, and have a unit of Ohm/m. In this case, since the electrical path of the source line 130 to the source line driver is increased as much as the electrical path of the bit line 150 to the bit line driver is decreased, the sum of the entire resistance value of the bit line 150 and the entire resistance value of the source line 130 may be constant or substantially constant when looking from each of the memory cells MC.

When the memory cells MC are connected to the second source wiring 133 to which the source line driver is connected instead of the first source wiring 131, the memory cell MC located on the left side in FIG. 6 may have a long electrical path of the bit line 150 to the bit line driver, and also have a longer electrical path of the source line 130 to the source line driver, when compared with the memory cell MC located on the right side. Accordingly, the sum of a resistance value of the bit line 150 and a resistance value of the source line 130 when looking from the memory cell MC located on the left side may be considerably greater than that of the resistance value of the bit line 150 and the resistance value of the source line 130 when looking from the memory cell MC located on the right side.

When sensing the resistance of the memory cell MC, the entire resistance of the bit line 150 and the entire resistance of the source line 130 when looking from the memory cell MC may be sensed together with the resistance of the memory cell MC. Accordingly, even when the resistance value of the memory cell MC located on the left side is the same or substantially the same as that of the memory cell MC located on the right side, the memory cell MC located on the left side may be sensed as having a greater resistance value than the memory cell MC located on the right side. Accordingly, when sensing the resistance of the memory cell MC, a margin having a relatively large width should be assigned in consideration of parasitic resistance including the resistance of the bit line 150 and the resistance of the source line 130.

According to at least this example embodiment of inventive concepts, since the sum of the entire resistance value of the bit line 150 and the entire resistance value of the source line 130 when looking from each of the memory cells MC is constant or substantially constant, the width of the margin may be decreased since it is not necessary to consider the parasitic resistance according to the bit line 150 and the source line 130 when measuring the resistance of the memory cell MC.

A circuit diagram of the memory cell array according to at least one example embodiment of inventive concepts is illustrated in FIG. 6, but it is only an example, and inventive concepts are not limited to the circuit diagram shown in FIG. 6.

Figure 7:
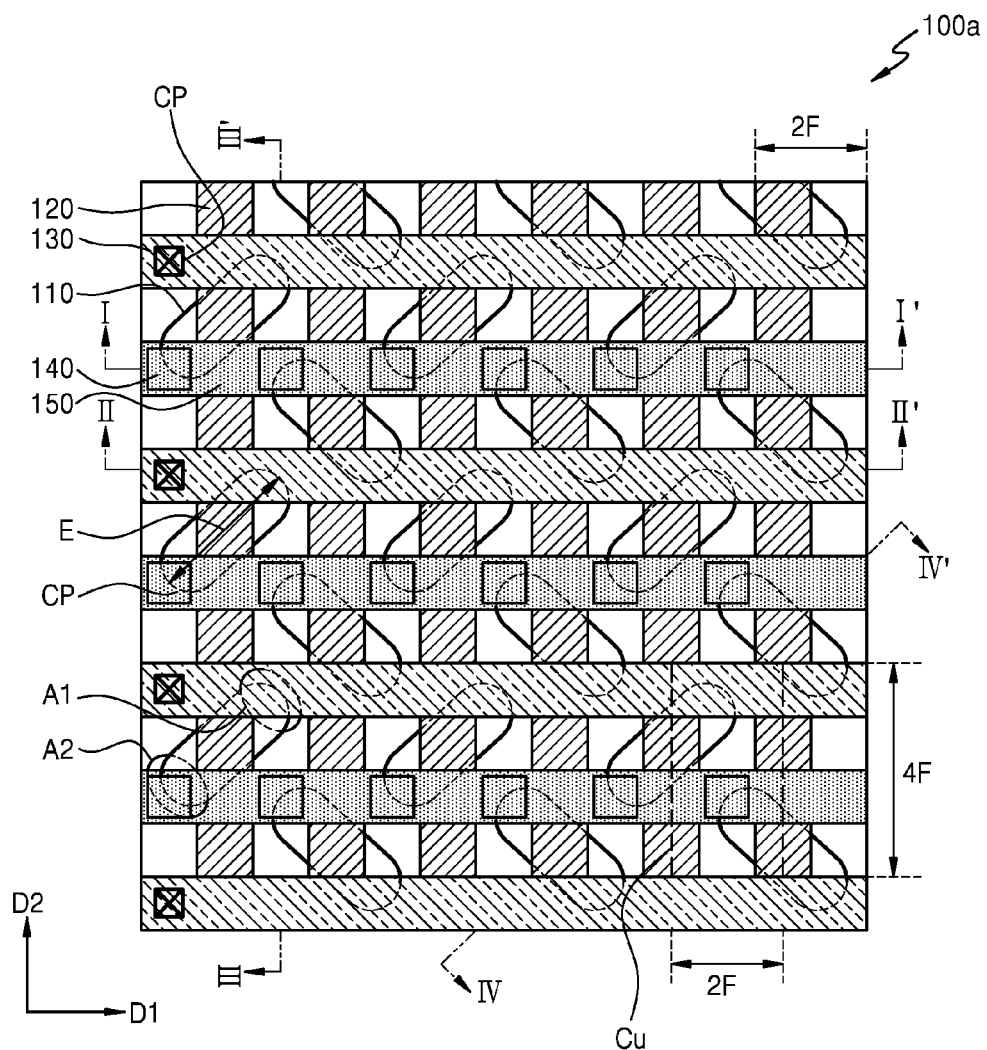
FIG. 7 is a diagram illustrating a layout of a resistive memory device according to another example embodiment of inventive concepts.
Figure 8A:
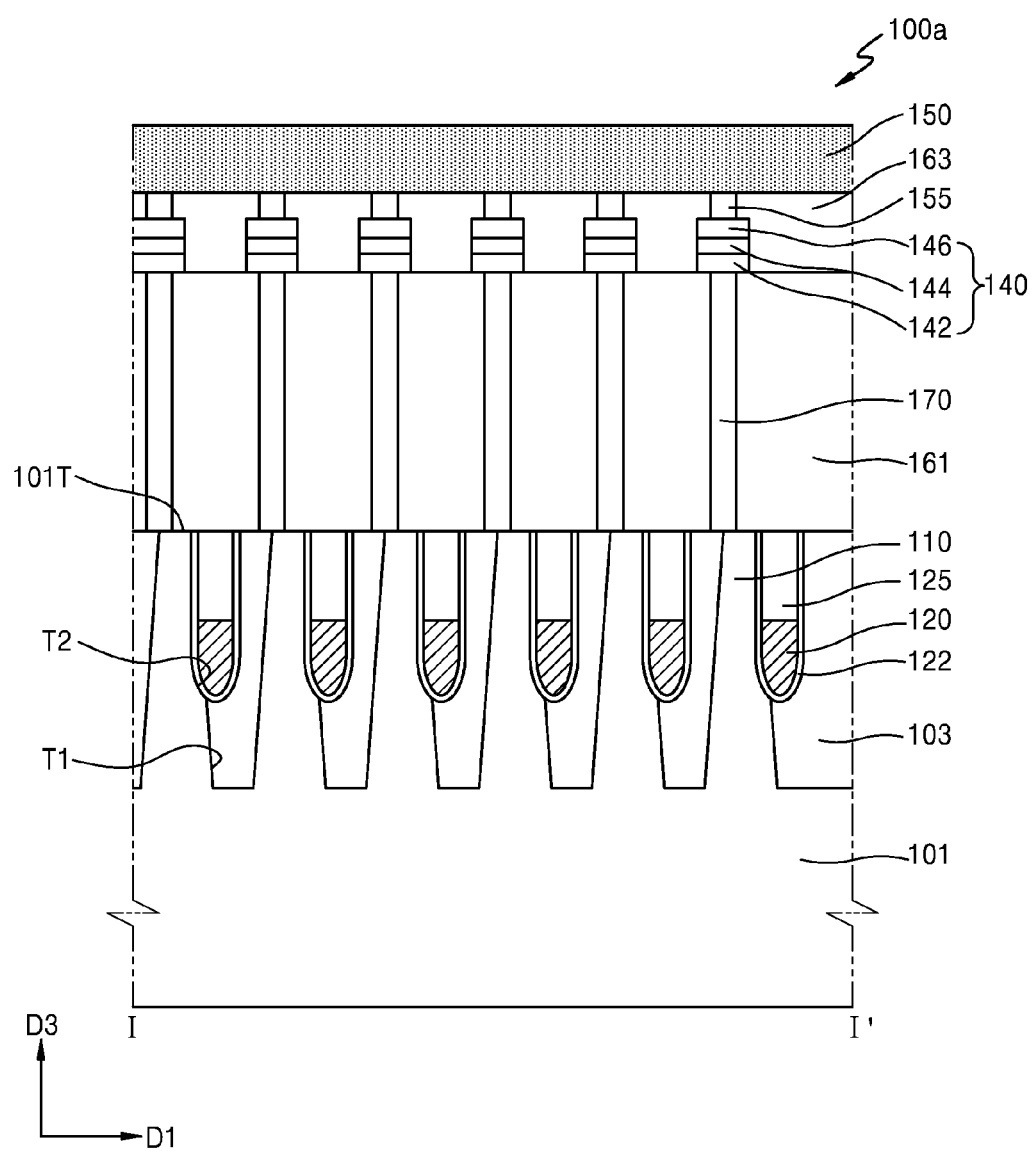
FIGS. 8A to 8D are cross-sectional views taken along lines I-I', II-II', III-III', and IV-IV' shown in FIG. 7, respectively.
Figure 8B:
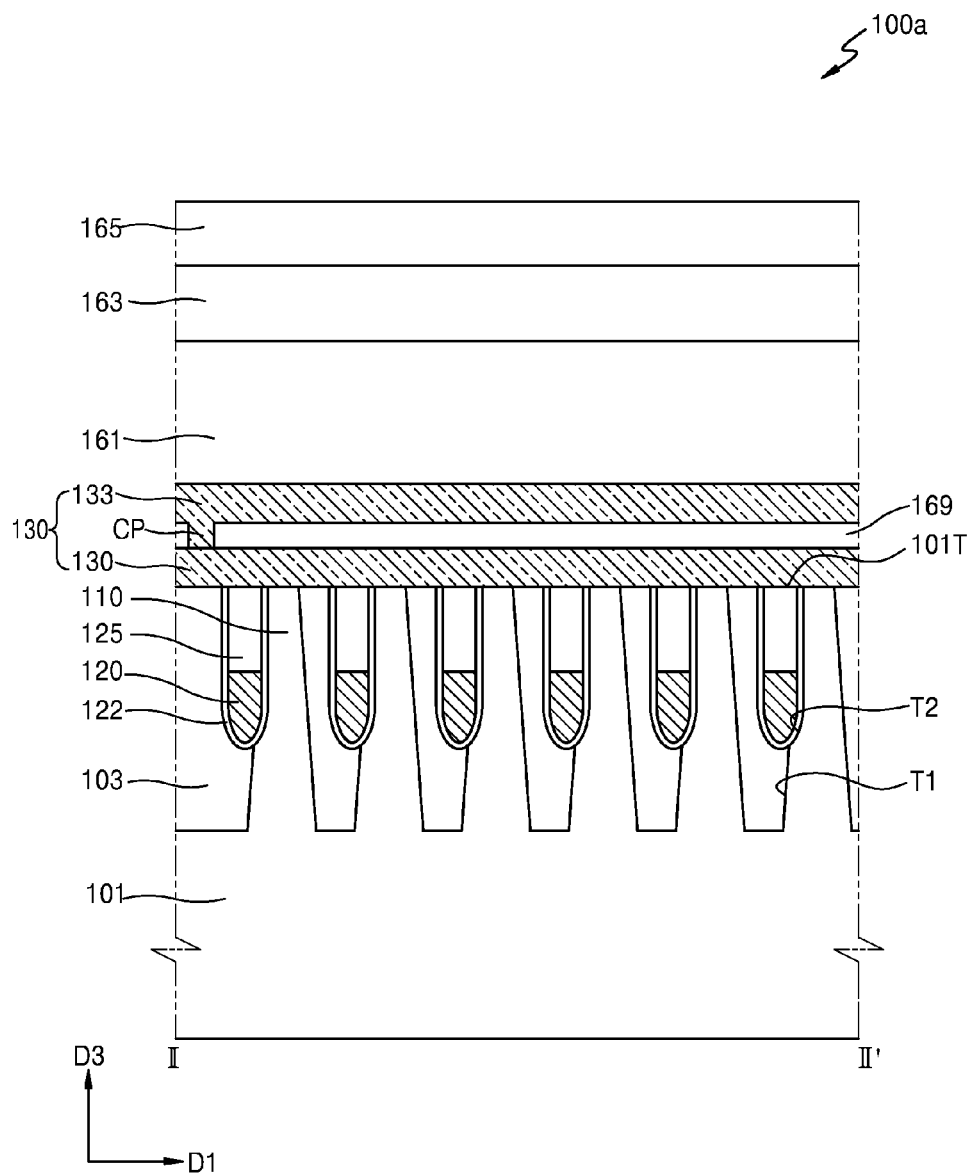
Figure 8C:
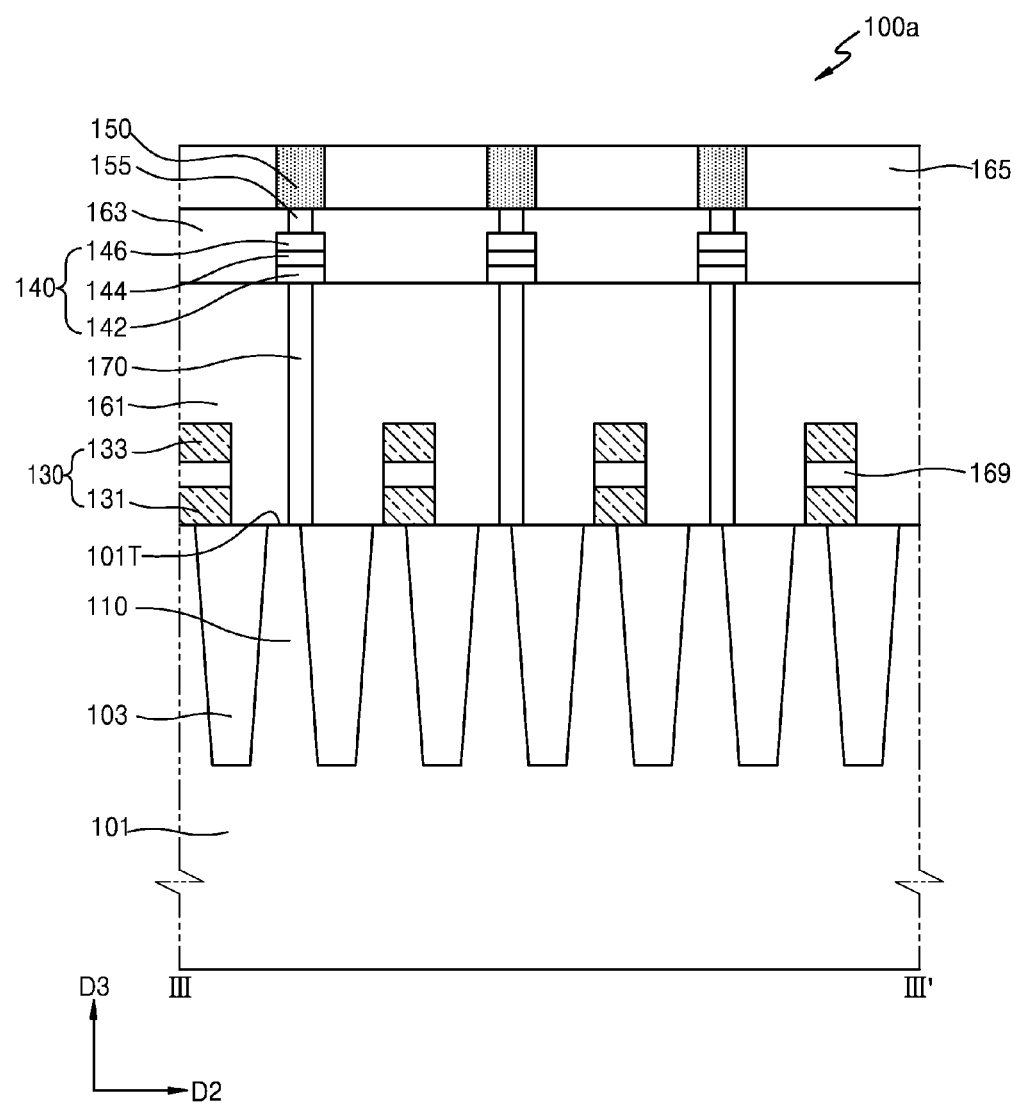
Figure 8D:
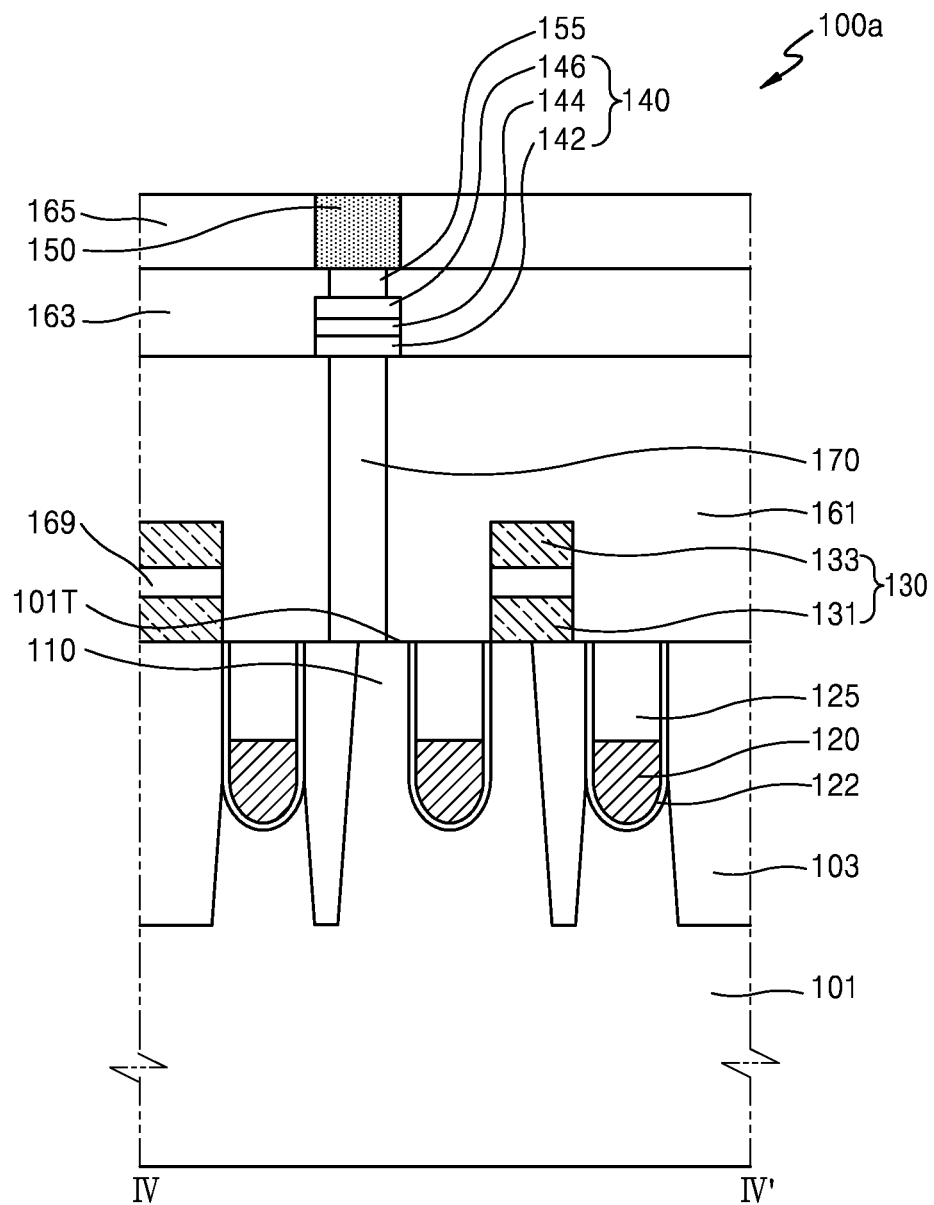

FIG. 7 is a diagram illustrating an example layout of the resistive memory device according to another example embodiment of inventive concepts. The layout shown in FIG. 7 may correspond to the memory cell array of the resistive memory device shown in FIG. 6.

Referring to FIG. 7, a resistive memory device 100a may include a plurality of memory cells C (see FIG. 6) arranged in a matrix form. The resistive memory device 100a may include active regions 110, word lines 120, source lines 130, a variable resistance structure 140, and bit lines 150. The resistive memory device 100a may be substantially the same as the resistive memory device 100 shown in FIG. 4 excluding the source lines 130 and the bit lines 150, and descriptions regarding the same components will be omitted.

The source lines 130 may be arranged in parallel or substantially parallel with each and space apart in a second direction D2 while extending along a first direction D1. Each of the source lines 130 may be electrically connected to a first region A1 of each of the active regions 110, and be arranged to overlap a portion of the first region A1. The source line 130 may include at least one material among a metal, a conductive metal nitride, a metal-semiconductor compound, and a doped semiconductor. Meanwhile, a width of the source line 130 may be about 1 F, and a pitch between the source lines 130 in a second direction D2 may be about 4 F.

Although not shown in FIG. 4, the source line 130 may include a first source wiring 131 and a second source wiring 133. The second source wiring 133 may be electrically connected to the first source wiring 131 through a contact plug CP. Each of the first source wirings 131 may be electrically connected to the first regions A1 of the active regions 110 arranged in the same row.

The variable resistance structures 140 may be arranged along the first direction D1 and the second direction D2 to correspond to second regions A2 of the active regions 110. The variable resistance structures 140 may be disposed between the bit line 150 and the second regions A2 of the active regions 110, and be connected to the second regions A2 of the active regions 110 as well as the bit lines 150.

The bit lines 150 may be arranged in parallel or substantially parallel with each other and spaced apart in the second direction D2 while extending along the first direction D1, like the source lines 130. The bit lines 150 and the source lines 130 may be alternately arranged along the second direction D2. Each of the bit lines 150 may be electrically connected to the second region A2 of each of the active regions 110, and be arranged to overlap a portion of the second region A2. Each of the bit lines 150 may be electrically connected to the second region A2 of the active region 110 through the variable resistance structure 140.

The bit line 150 may include at least one material among a metal, a conductive metal nitride, a metal-semiconductor compound, and a doped semiconductor. Meanwhile, a width of the bit line 150 may be about 1 F, and a pitch between the bit lines 150 in the second direction D2 may be about 4 F.

FIGS. 8A to 8D are cross-sectional views taken along lines I-I', II-II', III-III', and IV-IV' shown in FIG. 7, respectively.

The resistive memory device 100a shown in FIGS. 8A to 8D may be substantially the same as the resistive memory device 100 shown in FIGS. 6A to 6D excluding the source lines 130 and the bit lines 150, and descriptions regarding the same components will be omitted.

Referring to FIGS. 8A to 8D, a substrate 101 in which an isolation film 103 is formed may be included. The isolation film 103 may be formed in an isolation trench T1 formed in the substrate 101.

The word lines 120 may extend along the second direction D2 on the active regions 110. The word lines 120 may have a buried word line structure formed in a gate trench T2 formed in the substrate 101. A gate dielectric film 122 insulating the word lines 120 from the substrate 101 may be formed in the gate trench T2. A buried insulating film 125 may be filled on the word lines 120 in the gate trench T2.

The source lines 130 may be formed on an upper surface 101T of the substrate 101 and on the isolation film 103. The source lines 130 may be electrically connected to the first region A1 of the active region 110 by being in contact with the first region A1 (see FIG. 7) of the active regions 110. The source lines 130 may be arranged in parallel or substantially parallel with each other and spaced apart in the second direction D2 while extending along the first direction D1 (see FIG. 7).

Each of the source lines 130 may include a first source wiring 131, and a second source wiring 133 connected to the first source wiring 131 through a third contact plug CP. The second source wiring 133 may be isolated from the first source wiring 131 by a fourth insulating layer 169. A third contact plug CP may connect the first source wiring 131 and the second source wiring 133 by penetrating through the fourth insulating layer 169. The fourth insulating layer 169 may be formed as an oxide film, a nitride film or a combination thereof. The fourth insulating layer 169 having a single layer structure is illustrated, but it is not limited thereto, and the fourth insulating layer 169 may be formed to have a multi-layer structure formed of the same material, substantially the same material or different materials. The second source wiring 133 may be disposed on the first source wiring 131, and be connected to the first source wiring 131 through the third contact plug CP.

Each of the first source wirings 131 may be electrically connected to the first region A1 of the active region 110 by being in contact with the first region A1 (see FIG. 7) of the corresponding active region 110. A second contact plug CP may be disposed adjacent to an end of the second source wiring 133, and electrically connect an end of the first source wiring 131 and the end of the second source wiring 133.

A metal silicide film (not shown) may be formed between the first source wirings 131 and the active region 110. The metal silicide film may perform a function of decreasing a contact resistance between a source/drain region formed in the active region 110, for example, the first region A1 (see FIG. 7) of the active region 110, and the source line 130. However, the metal silicide film may be omitted, and as shown, the source lines 130 may be in contact (e.g., direct contact) with the first regions A1 of the active regions 110.

A first insulating layer 161 covering the source lines 130 may be formed on the upper surface 101T of the substrate 101 and on the isolation film 103. The first insulating layer 161 may be formed as an oxide film, a nitride film or a combination thereof. The first insulating layer 161 having a single layer structure is illustrated, but it is not limited thereto, and the first insulating layer 161 may have a multi-layer structure formed of the same material, substantially the same material or different materials.

First contact plugs 170 which are in contact with the second regions A2 (see FIG. 7) of the active regions 110 by penetrating through the first insulating layer 161 may be formed on the upper surface 101T of the substrate 101 and on the isolation film 103.

A metal silicide film (not shown) may be formed between the first contact plugs 170 and the second regions A2 of the active regions 110. The metal silicide film may perform a function of decreasing a contact resistance between the second regions A2 of the active regions 110, for example, the source/drain regions of the plurality of active regions 110, and the first contact plugs 170. However, the metal silicide film may be omitted, and as shown, the plurality of contact plugs 170 may be in contact (e.g., direct contact) with the second regions A2 of the active regions 110.

The variable resistance structures 140 may be disposed on the first contact plugs 170, respectively. The variable resistance structures 140 may be electrically isolated by a second insulating layer 163. Each of the variable resistance structures 140 may write data according to a resistance state.

The bit lines 150 may be formed on the variable resistance structures 140. The bit lines 150 may be arranged in parallel or substantially parallel with each other in the second direction D2 while extending extended along the first direction D1. The bit lines 150 may be electrically insulated by a third insulating layer 165.

Each of the bit lines 150 may be electrically connected to a corresponding variable resistance structure 140 through the second contact plug 155. The bit lines 150 may be electrically connected to the second region A2 of the active region 110 through the second contact plug 155, the variable resistance structure 140, and the first contact plug 170.

Figure 5A:
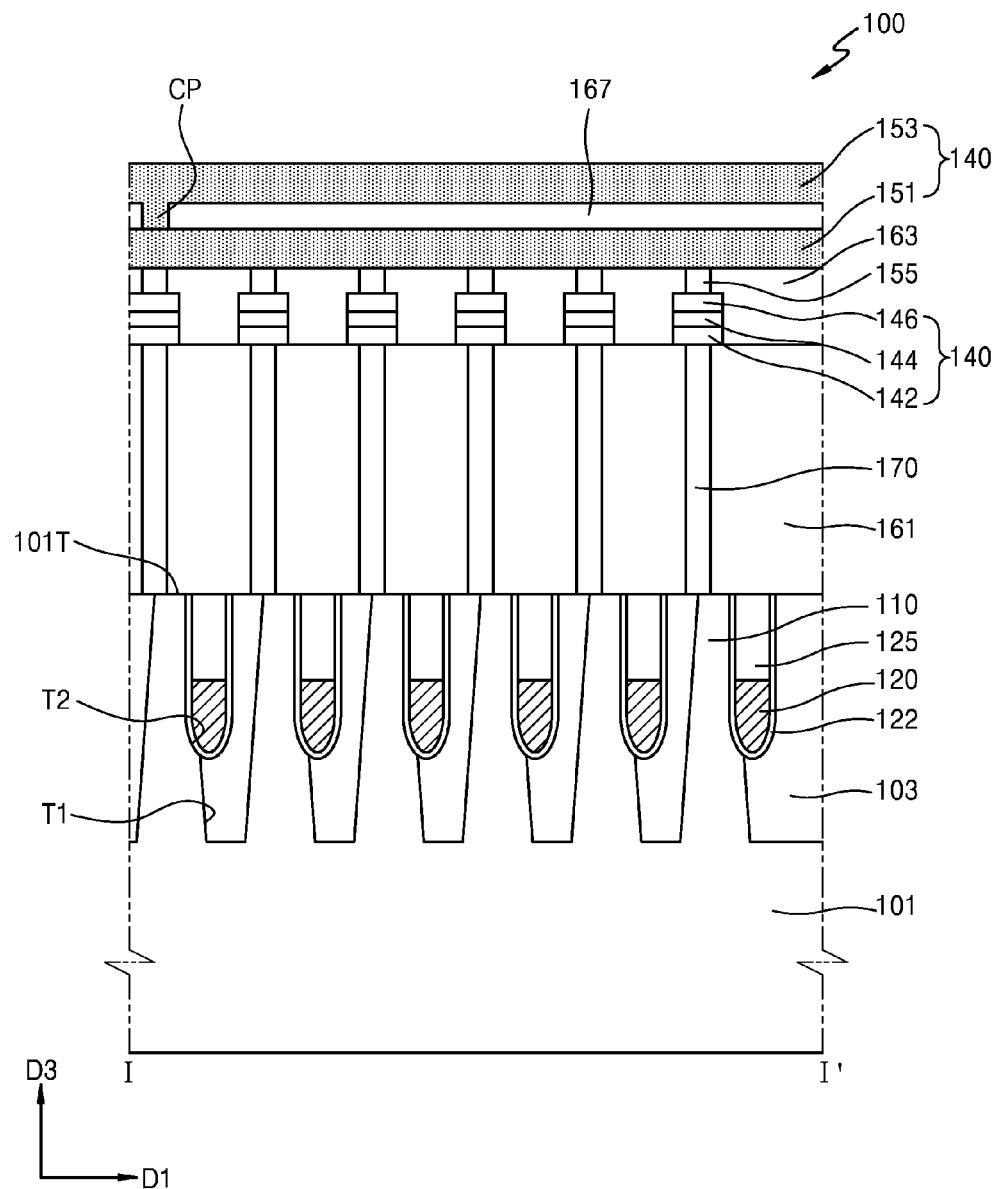
FIGS. 5A to 5D are cross-sectional views taken along lines I-I', II-II', III-III', and IV-IV' shown in FIG. 4, respectively.
Figure 5B:
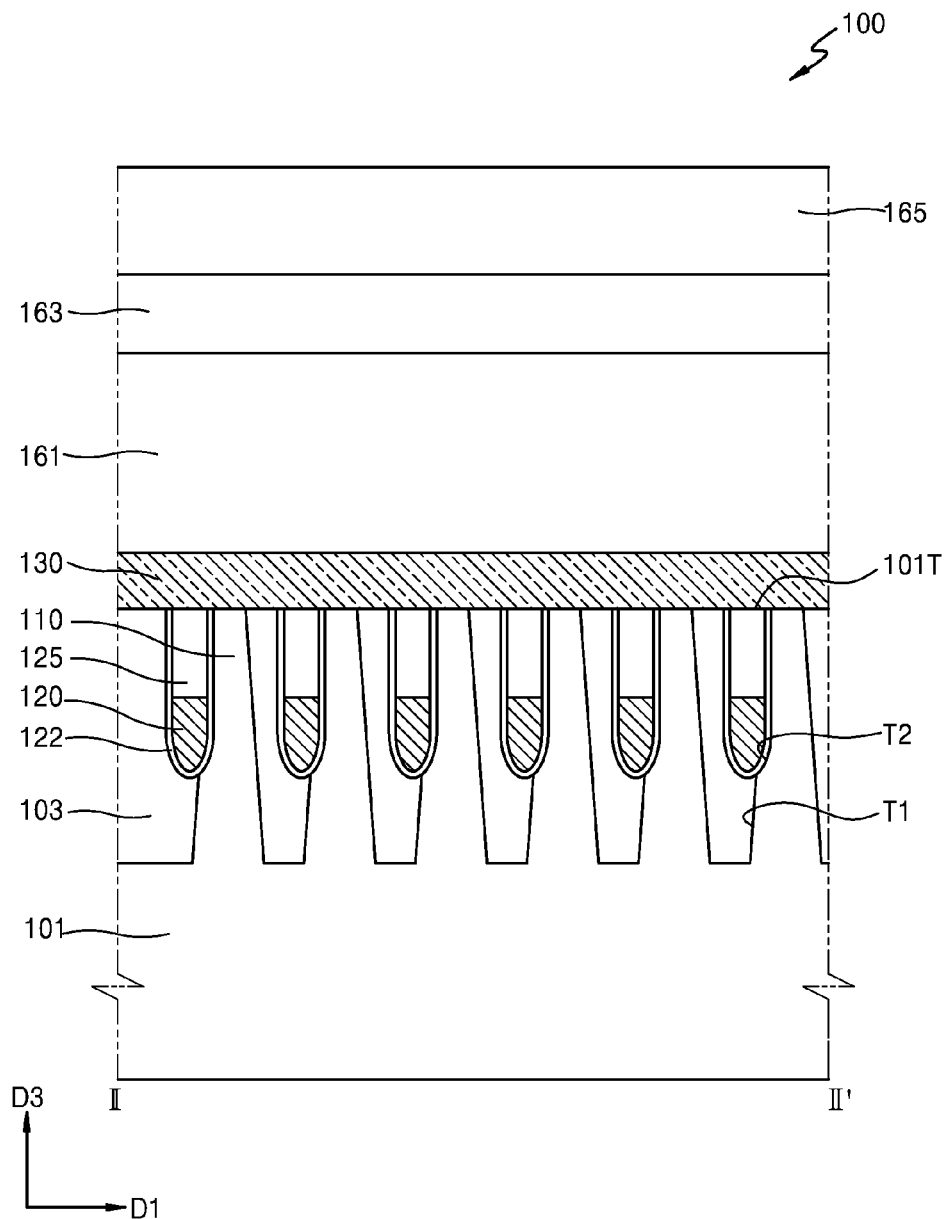
Figure 5C:
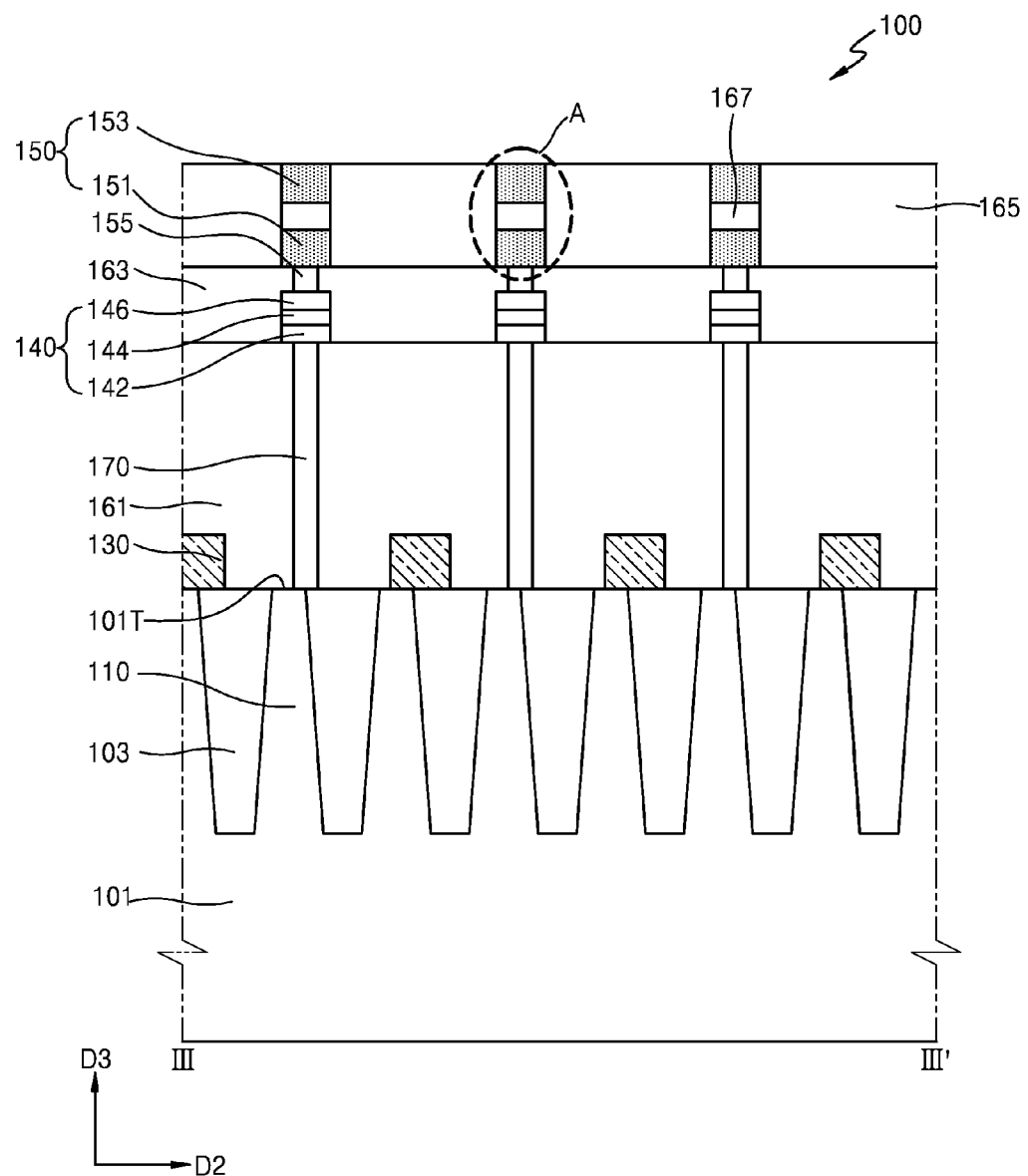
Figure 5D:
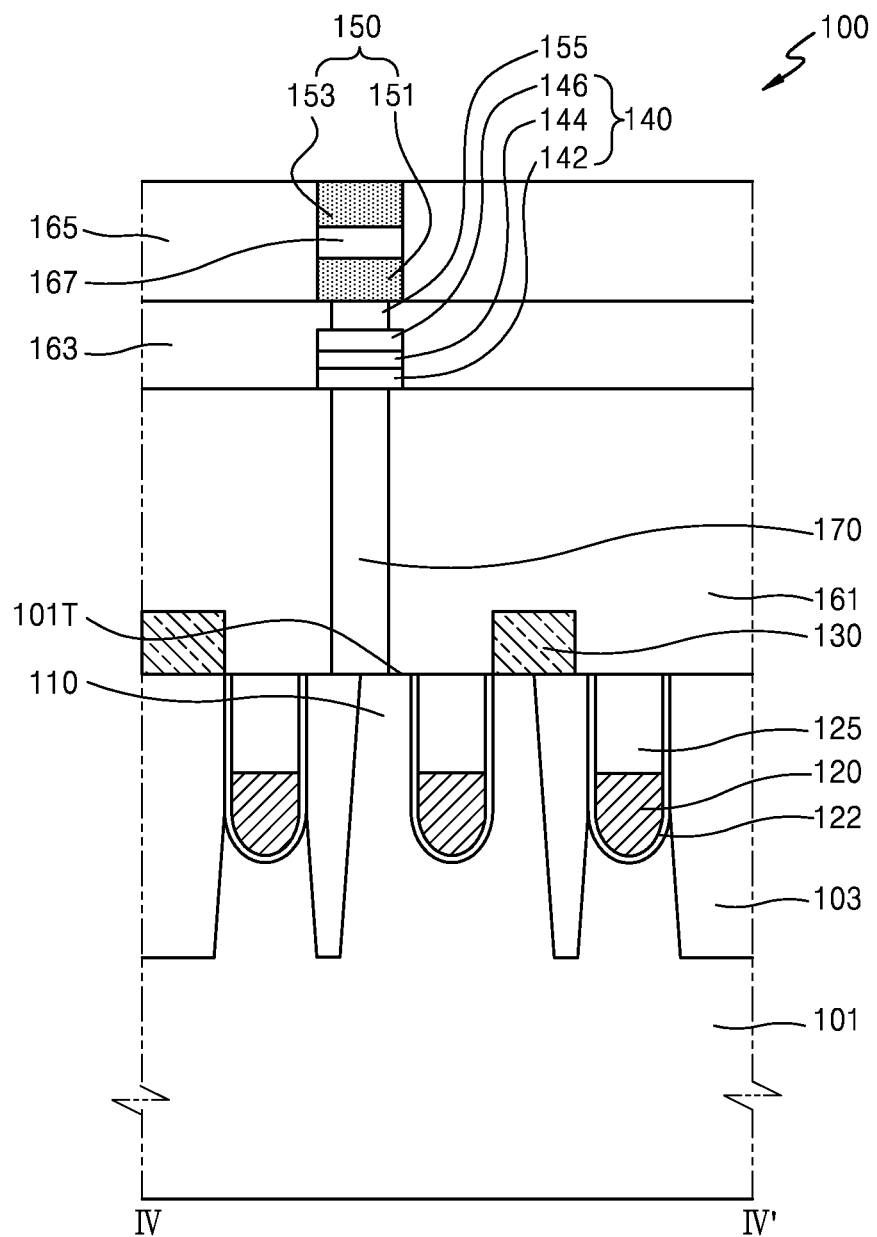
Figure 9:
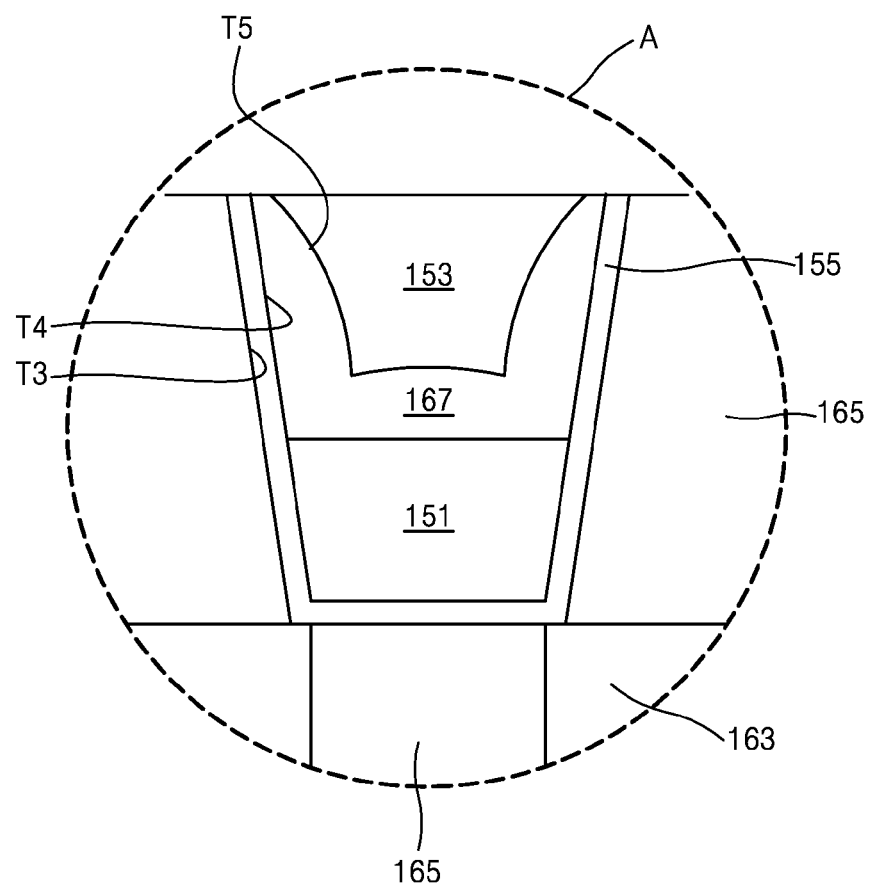
FIG. 9 is a cross-sectional view of an example embodiment of the bit line 150 shown in FIG. 5C.

FIG. 9 is a cross-sectional view of an example embodiment of the bit line 150 shown in FIG. 5C.

Referring to FIG. 9, the bit line 150 may include a first bit wiring 151 and a second bit wiring 153 of a two-layer structure formed in a space in which one metal line is formed.

A third trench T3 may be formed in the third insulating layer 165. For example, a barrier film 155 formed of TaN may be formed in the third trench T3. However, the barrier film 155 may be omitted according to a material of the first bit wiring 151 and the second bit wiring 153.

A fourth trench T4 having a smaller size than the third trench T3 may be formed by the barrier film. The first bit wiring 151 may be formed in a portion in the fourth trench T4. For example, the first bit wiring 151 may be formed of tungsten (W). For example, in order to form the first bit wiring 151, a metal material layer formed of W may be buried in the fourth trench T4. The first bit wiring 151 may be formed by removing a portion of the metal material layer in the fourth trench T4 using an etch-back process.

A fourth insulating layer 167 may be formed on an upper surface of the first bit wiring 151 and on a sidewall of the fourth trench T4. A fifth transistor T5 having a smaller size than the fourth trench T4 may be formed by the fourth insulating layer 167. The second bit wiring 153 filling the fifth trench T5 may be formed. For example, the second bit wiring 153 may be formed of Cu. For example, in order to form the second bit wiring 153, a metal material layer formed of Cu may fill the fifth trench T5. Then, the second bit wiring 153 shown in FIG. 9 may be formed by removing the metal material layer using a chemical mechanical polishing (CMP) process to expose an upper surface of the third insulating layer 165.

The materials proposed in accordance with one or more example embodiments of inventive concepts are only examples, and are not limited thereto.

Figure 10:
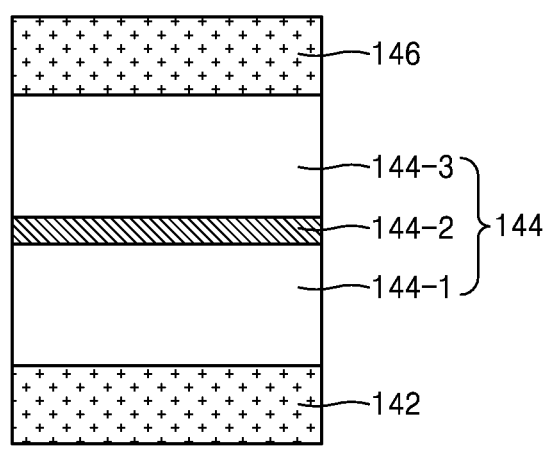
FIG. 10 is a cross-sectional view for describing an example embodiment of a variable resistance structure 140 shown in FIGS. 5A to 5D.

FIG. 10 is a cross-sectional view for describing an example structure of the variable resistance structure 140 shown in FIGS. 5A to 5D.

Referring to FIG. 10, the variable resistance structure 140 may include a lower electrode 142, an upper electrode 146, and a variable resistance layer 144 including a first magnetization layer 144-1, a tunnel barrier layer 144-2, and a second magnetization layer 144-3, which are sequentially stacked between the lower electrode 142 and the upper electrode 146. One of the first magnetization layer 144-1 and the second magnetization layer 144-3 may include a pinned layer, and the other of the first magnetization layer 144-1 and the second magnetization layer 144-3 may include a free layer, but inventive concepts are not limited thereto. For example, the first magnetization layer 144-1 and the second magnetization layer 144-3 may include at least one pinned layer and at least one free layer. Further, a structure including one tunnel barrier layer 144-2 is illustrated in FIG. 6, but inventive concepts are not limited thereto, and a plurality of tunnel barrier layers may be included between the lower electrode 142 and the upper electrode 146.

The pinned layer may have a magnetization easy axis in a direction perpendicular or substantially perpendicular to a film surface, and a magnetization direction may be fixed. The free layer may have a magnetization easy axis in a direction perpendicular or substantially perpendicular to the film surface, and a magnetization direction may vary according to a condition.

A resistance value of the MTJ of the variable resistance structure 140 may vary according to the magnetization direction of each of the first magnetization layer 144-1 and the second magnetization layer 144-3. For example, when the magnetization directions of the first magnetization layer 144-1 and the second magnetization layer 144-3 are anti-parallel with each other, the variable resistance structure 140 may have a relatively high resistance value and write data "1." When the magnetization directions of the first magnetization layer 144-1 and the second magnetization layer 144-3 are in parallel or substantially parallel, the variable resistance structure 140 may have a relatively small resistance value and write data "0." The resistive memory device 100 may write/read the data using a difference of the resistance values.

In at least some example embodiments, the variable resistance structure 140 may be used for implementing the MTJ device of a vertical magnetization method. In at least some example embodiments, the magnetization direction in the free layer of the variable resistance structure 140 may be changed by an STT.

In some other example embodiments, the variable resistance structure 140 may have a horizontal MTJ structure in which a movement direction of a current and the magnetization easy axis are vertical or substantially vertical.

The lower electrode 142 and the upper electrode 146 may include a conductive material having a comparatively low reactivity. In at least some example embodiments, the lower electrode 142 and the upper electrode 146 may include a conductive metal nitride. For example, each of the lower electrode 142 and the upper electrode 146 may have a single layer structure formed of at least one material selected among Ti, Ta, ruthenium (Ru), TiN, TaN, and W, or a multi-layer structure including a plurality of materials.

The tunnel barrier layer 144-2 may have a thickness smaller than a spin diffusion distance. The tunnel barrier layer 144-2 may include a non-magnetic material. In at least some example embodiments, the tunnel barrier layer 144-2 may be formed of an oxide of any one material selected among magnesium (Mg), Ti, aluminum (Al), magnesium zinc (MgZn), and magnesium boron (MgB). In at least some other example embodiments, the tunnel barrier layer 144-2 may be formed of a Ti nitride, or a vanadium (V) nitride.

In at least some example embodiments, at least one of the first magnetization layer 144-1 and the second magnetization layer 144-3 may include at least one selected among iron (Fe), cobalt (Co), nickel (Ni), palladium (Pd), and platinum (Pt). In some embodiments, at least one of the first magnetization layer 144-1 and the second magnetization layer 144-3 may include a Co-M1 alloy (here, M1 may be at least one metal selected among Pt, Pd, and Ni), or a Fe-M2 alloy (here, M2 may be at least one metal selected among Pt, Pd, and Ni). In at least some other example embodiments, at least one of the first magnetization layer 144-1 and the second magnetization layer 144-3 may further include at least one material selected among boron (B), carbon (C), Cu, silver (Ag), gold (Au), Ru, Ta, and chromium (Cr).

In at least some example embodiments, at least one of the first magnetization layer 144-1 and the second magnetization layer 144-3 may include a perpendicular magnetic anisotropy (PMA) material. In at least some example embodiments, at least one of the first magnetization layer 144-1 and the second magnetization layer 144-3 may have a synthetic anti-ferromagnet (SAF) structure. The SAF structure may be a structure in which a Ru intermediate layer is inserted in a ferromagnetic stack structure. For example, the SAF structure may be a multi-layer structure of CoFeB/Ta/(Co/Pt)m/Ru/(Co/Pd)n (here, m and n are natural numbers). The SAF structure, which is applicable to the magnetoresistive device according to one or more example embodiments of inventive concepts, is not limited to the examples described above, and various modified structures may be applied.

According to at least some other example embodiments of inventive concepts, the variable resistance structure 140 shown in FIGS. 5A to 5D may include a lower electrode 142, an upper electrode 146, and a variable resistance layer 144 arranged between the lower electrode 142 and the upper electrode 146. The variable resistance layer 144 may include a phase change material layer 144. A resistance of the phase change material layer 144 may vary with being changed into a crystal state or an amorphous state according to the current flowing between the lower electrode 142 and the upper electrode 146. In this case, the resistive memory device 100 may be applied to a PRAM device.

The lower electrode 142 may be formed in a lower portion of the phase change material layer 144 and heat the phase change material layer 144, and thus, a phase change may be generated in the phase change material layer 144.

The lower electrode 142 may include a metal or a metal compound such as a metal nitride or a metal silicon nitride. For example, the lower electrode 142 may include a metal such as W, Al, Cu, Ta, Ti, Molybdenum (Mo), Niobium (Nb), Zirconium (Zr), etc., a metal nitride thereof, or a metal silicon nitride thereof, etc. The materials may be used alone or in combination.

The phase change material layer 144 may be formed on the lower electrode 142, and a lower surface of the phase change material layer 144 may have the same or substantially the same shape and/or dimension as an upper surface of the lower electrode 142. The phase change material layer 144 may include a chalcogenide-based material in which germanium (Ge), antimony (Sb), and/or tellurium (Te) are combined in a given (or, alternatively, desired or predetermined) ratio. The phase change material layer 144 may include Ge, Sb, Te, and one or more kinds of impurities (X). That is, for example, the phase change material layer 144 may be formed by adding one or more impurities selected from groups III, IV, V, and VI in a Ge—Sb—Te system. In one or more example embodiments, composition of the phase change material layer 144 may be expressed as $X_aGe_bSb_cTe_{1-(a+b+c)}$. The impurities (X) may be selected among B, C, nitrogen (N), oxygen (O), Al, Si, phosphorous (P), and sulfur (S). The impurities may be selected from C, N, or O. Alternatively, the impurities may be bismuth (Bi).

The upper electrode 146 may be formed in contact with the phase change material layer 144. For example, the upper electrode 146 may include a material, which is the same as, substantially the same as, or similar to the lower electrode 142.

According to at least some other example embodiments of inventive concepts, the variable resistance structure 140 shown in FIGS. 5A to 5D may include the lower electrode 142, the upper electrode 146, and the variable resistance layer 144 arranged between the lower electrode 142 and the upper electrode 146. The variable resistance layer 144 may include a material in which an electrical resistance varies with oxygen vacancy or movement. In this case, the resistive memory device 100 may be a ReRAM device.

The variable resistance layer 144 may include a perovskite-based material or a transition metal oxide. For example, the perovskite-based material may include STO ($SrTiO_3$), BTO($BaTiO_3$), PCMO($Pr_{1-x}Ca_xMnO_3$), etc. For example, the transition metal oxide may include titanium oxide ($TiO_x$), zirconium oxide ($ZrO_x$), aluminum oxide ($AlO_x$), hafnium oxide ($HfO_x$), tantalum oxide ($TaO_x$), niobium oxide ($NbO_x$), cobalt oxide ($CoO_x$), tungsten oxide ($WO_x$), lanthanum oxide ($LaO_x$), and zinc oxide ($ZnO_x$), etc. The materials may be used alone or in combination.

The variable resistance layer 144 may have a structure in which a plurality of layers including the above-described materials are stacked. For example, the variable resistance layer 144 may have a structure in which a first hafnium oxide ($HfO_2$) film, a second hafnium oxide ($HfO_x$) film, and a zirconium oxide ($ZrO_x$) film are stacked. The variable resistance layer 144 may have a structure in which a titanium aluminum oxide ($TiAlO_x$) film, a tantalum oxide ($TaO_x$) film, and an aluminum oxide ($AlO_x$) film are stacked.

Hereinafter, an example in which the memory cell of the resistive memory device according to example embodiments of inventive concepts is a magnetoresistive device will be described.

Figure 11:
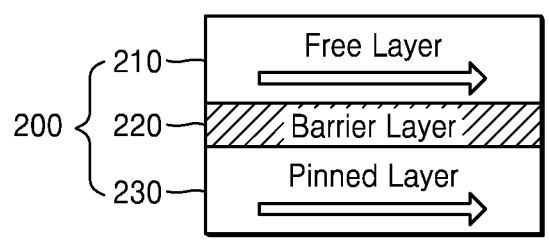
FIG. 11 is a cross-sectional view for describing a magnetoresistive device included in a resistive memory device according to example embodiments of inventive concepts.

FIG. 11 is a cross-sectional view for describing a magnetoresistive device included in the resistive memory device according to example embodiments of inventive concepts.

Referring to FIG. 11, a magnetoresistive device 200 may include a free layer 210, a pinned layer 230, and a barrier layer 220 interposed between the free layer 210 and the pinned layer 230. The magnetoresistive device 200 may correspond to the memory cell MC of FIGS. 1 and 6.

The free layer 210 may have a magnetization easy axis in a direction perpendicular or substantially perpendicular to a film surface forming the free layer 210, and a magnetization direction of the free layer 210 may vary according to a condition. The pinned layer 230 may have a magnetization easy axis in a direction perpendicular or substantially perpendicular to a film surface forming the pinned layer 230, and a magnetization direction of the pinned layer 230 may be fixed. A resistance value of the magnetoresistive device 200 may vary according to the magnetization direction of the free layer 210. When the magnetization direction of the free layer 210 and the magnetization direction of the pinned layer 230 are in parallel, the magnetoresistive device 200 may have a relatively small resistance value and write data "0." When the magnetization direction of the free layer 210 and the magnetization direction of the pinned layer 230 are in anti-parallel, the magnetoresistive device 200 may have a relatively high resistance value and write data "1." In FIG. 11, positions of the pinned layer 230 and the free layer 210 are not limited to the example described above, and the positions may be reversed. The data written in the magnetoresistive device 200 may also be reversed according to the magnetization direction of the free layer 210.

Each of the free layer 210 and the pinned layer 230 may have interface perpendicular magnetic anisotropy (IPMA) in a boundary surface (e.g., a contact surface) with the barrier layer 220. For this, the free layer 210 and the pinned layer 230 may be formed of a ferromagnetic material. For example, the ferromagnetic material may have a comparatively high magnetic anisotropy energy (Ku) of about 106 to 107 erg/cc. The free layer 210 and the pinned layer 230 may have the magnetization easy axis vertical or substantially vertical to the boundary surface due to the relatively high magnetic anisotropy energy.

The free layer 210 may be a magnetic layer having a variable magnetization direction. That is, for example, the free layer 210 may include a ferromagnetic material having a magnetic moment in which a magnetization direction is freely changed in a direction perpendicular or substantially perpendicular to a layer surface, and for example, the ferromagnetic material may include at least one among Co, Fe, and Ni, and further include another material such as B, Cr, Pt, Pd, etc. The free layer 210 may be formed of a material different from the pinned layer 230, but be formed of the same or substantially the same material as the pinned layer 230.

The pinned layer 230 may be a magnetic layer having a pinned magnetization direction, and a ferromagnetic material forming the pinned layer 230 may include at least one among Co, Fe, and Ni, and further include another material such as B, Cr, Pt, Pd, etc.

In the example embodiment of inventive concepts, the pinned layer 230 having a single layer is illustrated, but it is not limited thereto and may be formed as a multi-layer structure.

In at least some example embodiments, the pinned layer 230 may have a multi-layer structure in which a first layer formed of at least one of Co and a Co alloy and a second layer formed of at least one of Pt, Ni, and Pd are alternately stacked, or be a FePt layer or a CoPt layer having an L10 structure, or an alloy layer of a rare-earth element and a transition metal. Here, the rare-earth element may be at least one of terbium (Tb) and gadolinium (Gd), and the transition metal may be at least one of Ni, Fe, and Co. An alloy of the rare-earth element and the transition metal having various combinations may be used, and for example, CoFeB or CoFe may be used as a material of the pinned layer 230 among the above.

The barrier layer 220 may be interposed between the free layer 210 and the pinned layer 230 in order to increase a tunnel magnetoresistance ratio (TMR) of the magnetoresistive device 200. The barrier layer 220 may have a thickness of about 8 to 15 Å. The barrier layer 220 may have a smaller thickness than the spin diffusion distance. The barrier layer 220 may include a non-magnetic material. For example, the barrier layer 220 may include at least one selected among an oxide of Mg, Ti, Al, MgZn, and MgB, and a nitride of Ti and V. For example, the barrier layer 220 may have a multi-layer structure.

In at least some example embodiments, the free layer 210, the barrier layer 220, and the pinned layer 230 may have the same or substantially the same crystal structure. For example, each of the free layer 210, the barrier layer 220, and the pinned layer 230 may have a body centered cubit (BCC) crystal structure.

Figure 12:
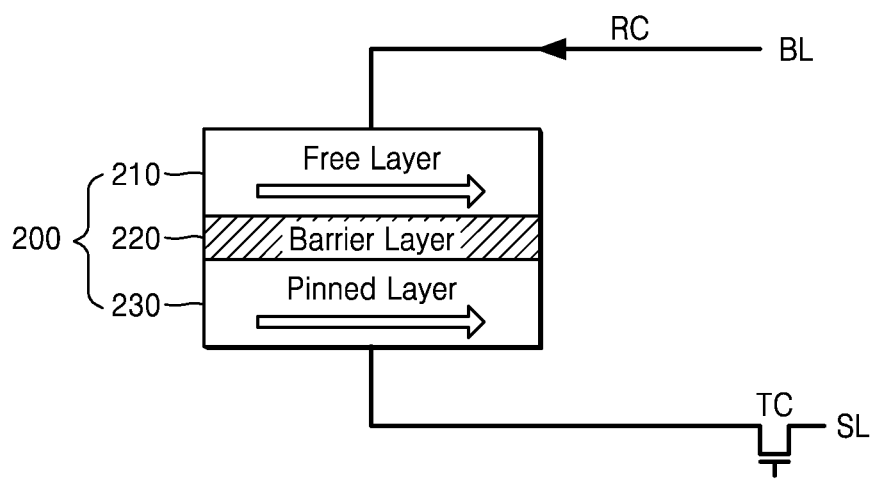
FIG. 12 is a diagram for describing an example read operation of data written in a magnetoresistive device included in a resistive memory device according to example embodiments of inventive concepts.

FIG. 12 is a diagram for describing an example read operation of data written in a magnetoresistive device included in the resistive memory device according to example embodiments of inventive concepts.

Figure 13:
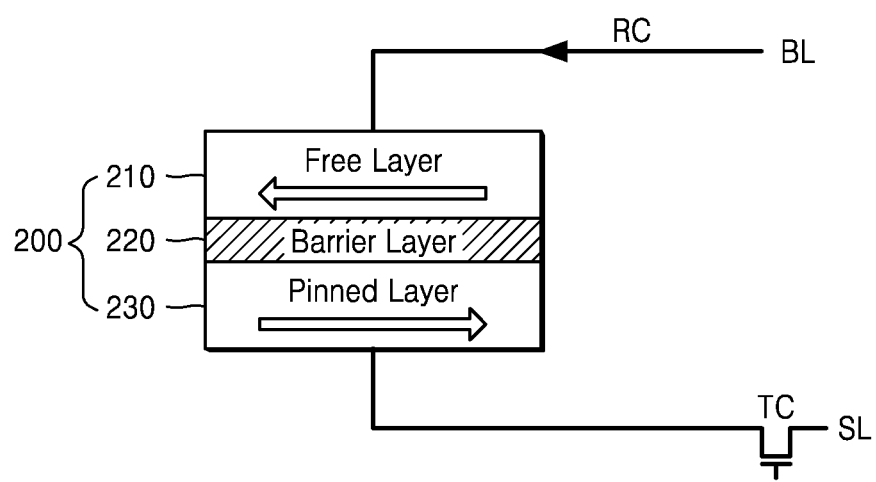
FIG. 13 is a diagram for describing an example read operation of data written in a magnetoresistive device included in a resistive memory device according to example embodiments of inventive concepts.

FIG. 13 is a diagram for describing an example read operation of data written in a magnetoresistive device included in the resistive memory device according to example embodiments of inventive concepts.

Referring to FIGS. 12 and 13, FIGS. 12 and 13 illustrate magnetization directions according to data written in the magnetoresistive device 200, respectively. Resistance values of the magnetoresistive device 200 may vary according to the magnetization direction of the free layer 210. When a read current RC flows through the magnetoresistive device 200, a data voltage may be output according to the resistance value of the magnetoresistive device 200. Because an intensity of the read current RC is smaller (e.g., much smaller) than that of a write current, the magnetization direction of the free layer 210 may not be changed by the read current RC.

Referring to FIG. 12, in the magnetoresistive device 200, the magnetization direction of the free layer 210 and the magnetization direction of the pinned layer 230 may be disposed in parallel. In this case, the magnetoresistive device 200 may have a relatively small resistance value. In this case, when the read current RC flows through the magnetoresistive device 200, the data "0" may be read.

Referring to FIG. 13, in the magnetoresistive device 200, the magnetization direction of the free layer 210 and the magnetization direction of the pinned layer 230 may be disposed in anti-parallel. In this case, the magnetoresistive device 200 may have a relatively high resistance value. In this case, when the read current RC flows through the magnetoresistive device 200, the data "1" may be read.

In at least this example embodiment of inventive concepts, the magnetoresistive device 200 including the free layer 210 and the pinned layer 230 using a horizontal magnetic device is illustrated, but as another example embodiment, the free layer 210 and the pinned layer 230 may use a vertical magnetic device.

Figure 14:
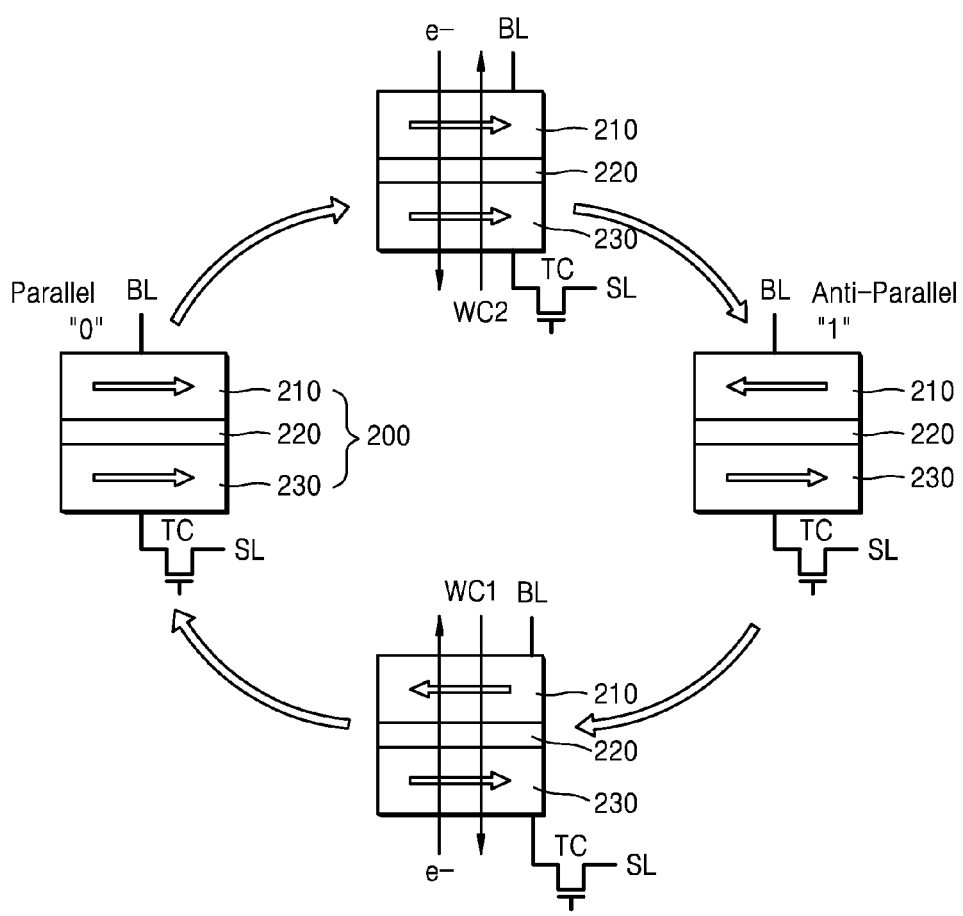
FIG. 14 is a diagram for describing an example write operation of a magnetoresistive device included in a resistive memory device according to example embodiments of inventive concepts.

FIG. 14 is a diagram for describing an example write operation of a magnetoresistive device included in the resistive memory device according to example embodiments of inventive concepts.

Referring to FIG. 14, a magnetization direction of the free layer 210 may be determined according to directions of write currents WC1 and WC2 flowing through the magnetoresistive device 200. For example, when a first write current WC1 is applied from the free layer 210 to the pinned layer 230, free electrons having the same spin direction as the pinned layer 230 may apply a torque to the free layer 210. Accordingly, the free layer 210 may be magnetized in parallel with the pinned layer 230.

When a second write current WC2 is applied from the pinned layer 230 to the free layer 210, free electrons having a direction opposite a spin direction of the pinned layer 230 may return to the free layer 210 and apply a torque. Accordingly, the free layer 210 may be magnetized anti-parallel with the pinned layer 230. That is, for example, in the magnetoresistive device 200, the magnetization direction of the free layer 210 may be changed by an STT.

Figure 15:
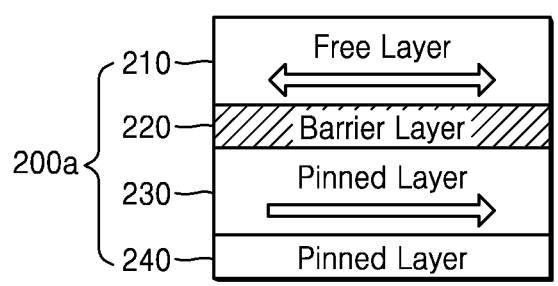
FIG. 15 is a cross-sectional view for describing a magnetoresistive device included in a resistive memory device according to example embodiments of inventive concepts.

FIG. 15 is a cross-sectional view for describing a magnetoresistive device included in the resistive memory device according to example embodiments of inventive concepts.

Referring to FIG. 15, a magnetoresistive device 200a may include a free layer 210, a barrier layer 220, a pinned layer 230, and an anti-ferromagnetic layer 240. The magnetoresistive device 200a may correspond to the memory cell MC of FIGS. 1 and 6.

The free layer 210 may include a material having a variable magnetization direction. The magnetization direction of the free layer 210 may be changed according to an electrical/magnetic factor provided from the outside and/or the inside of the magnetoresistive device 200a. The free layer 210 may include a ferromagnetic material including at least one among Co, Fe, and Ni. For example, the free layer 210 may include at least one selected among FeB, Fe, Co, Ni, Gd, dysprosium (Dy), CoFe, NiFe, manganese arsenic (MnAs), MnBi, MnSb, $CrO_2$, $MnOFe_2O_3$, $FeOFe_2O_3$, $NiOFe_2O_3$, $CuOFe_2O_3$, $MgOFe_2O_3$, europium oxide (EuO), and $Y_3Fe_5O_{12}$.

The barrier layer 220 may have a smaller thickness than a spin diffusion distance. The barrier layer 220 may include a nonmagnetic material. For example, the barrier layer 220 may include at least one selected from an oxide of Mg, Ti, Al, MgZn, and MgB, and a nitride of Ti, and V.

The pinned layer 230 may have the magnetization direction pinned by the anti-ferromagnetic layer 240. Further, the pinned layer 230 may include a ferromagnetic material. For example, the pinned layer 230 may include at least one selected among CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer 240 may include an anti-ferromagnetic material. For example, the anti-ferromagnetic layer 240 may include at least one selected among PtMn, iridium manganese (IrMn), MnO, MnS, MnTe, $MnF_2$, $FeCl_2$, FeO, $CoCl_2$, CoO, $NiCl_2$, NiO, and Cr.

Figure 16:
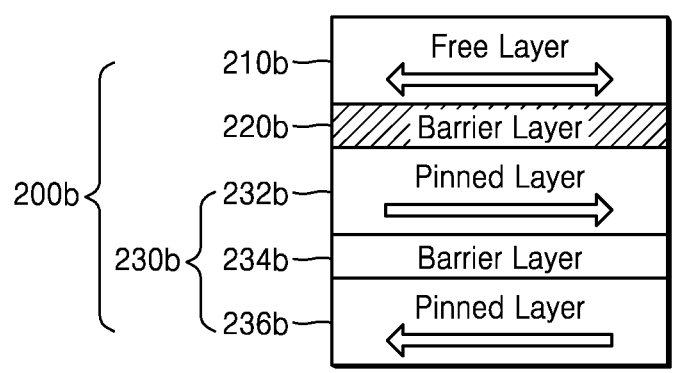
FIG. 16 is a cross-sectional view for describing a magnetoresistive device included in a resistive memory device according to example embodiments of inventive concepts.

FIG. 16 is a cross-sectional view for describing a magnetoresistive device included in the resistive memory device according to example embodiments of inventive concepts.

Referring to FIG. 16, a magnetoresistive device 200b may include a free layer 210b, a first barrier layer 220b, and a pinned layer 230b. The magnetoresistive device 200b may correspond to the example embodiment of the memory cell MC of FIGS. 1 and 6.

The pinned layer 230b may have an SAF structure. For example, the pinned layer 230b may include a first pinned layer 232b, a second barrier layer 234b, and a second pinned layer 236b.

For example, each of the first and second pinned layers 232b and 236b may include at least one selected among CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, the magnetization direction of the first pinned layer 232b and the magnetization direction of the second pinned layer 236b may be different from each other, and each of the magnetization directions may be fixed. For example, the second barrier layer 234b may include at least one among Ru, Cu, Al, Au, Ag, and a mixture thereof.

The first and second pinned layers 232b and 636b, which are magnetized in directions different from each other, may offset a stray magnetic field of each other. Accordingly, an influence of the stray magnetic field generated in the pinned layer 230b on the free layer 210b may be suppressed and/or prevented.

Figure 17:
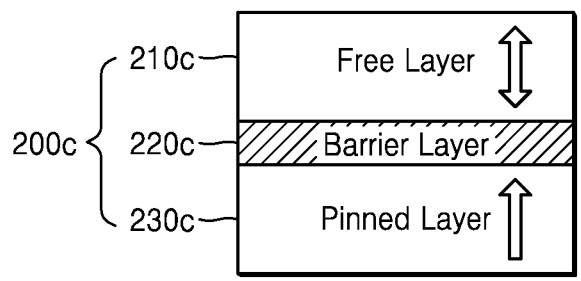
FIG. 17 is a cross-sectional view for describing a magnetoresistive device included in a resistive memory device according to example embodiments of inventive concepts.

FIG. 17 is a cross-sectional view for describing a magnetoresistive device included in the resistive memory device according to example embodiments of inventive concepts.

Referring to FIG. 17, a magnetoresistive device 200c may have a feature in which a magnetization direction is vertical or substantially vertical, and the movement direction of a current and a magnetization easy axis are in parallel or substantially parallel. The magnetoresistive device 200c may include a free layer 210c, a barrier layer 220c, and a pinned layer 230c. The magnetoresistive device 200c may correspond to the memory cell MC of FIGS. 1 and 6.

When the magnetization direction of the free layer 210c and the magnetization direction of the pinned layer 230c are in parallel, a resistance value may be decreased, and when the magnetization direction of the free layer 210c and the magnetization direction of the pinned layer 230c are in anti-parallel, the resistance value may be increased. Data may be written in the magnetoresistive device 200c according to the resistance value.

In order to implement the magnetoresistive device 200c in which the magnetization direction is vertical or substantially vertical, the free layer 210c and the pinned layer 230c may be formed of a material having relatively high magnetic anisotropy energy. The material having the relatively high magnetic anisotropy energy may be, for example, an amorphous rare-earth element alloy, a multi-layer thin film such as (Co/Pt)n or (Fe/Pt)n, and an ordered lattice material of an L10 crystal structure. For example, the free layer 210c may be an ordered alloy, and include at least one among Fe, Co, Ni, Pa, and Pt. Further, the free layer 210c may include at least one among a Fe—Pt alloy, a Fe—Pd alloy, a Co—Pt alloy, a Fe—Ni—Pt alloy, a Co—Fe—Pt alloy, and a Co—Ni—Pt alloy. For example, the alloys may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$, as a chemical quantitative expression.

The pinned layer 230c may be an ordered alloy, and include at least one among Fe, Co, Ni, Pa, and Pt. For example, the pinned layer 230c may include at least one among a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. For example, the alloys may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$, as a chemical quantitative expression.

Figure 18:
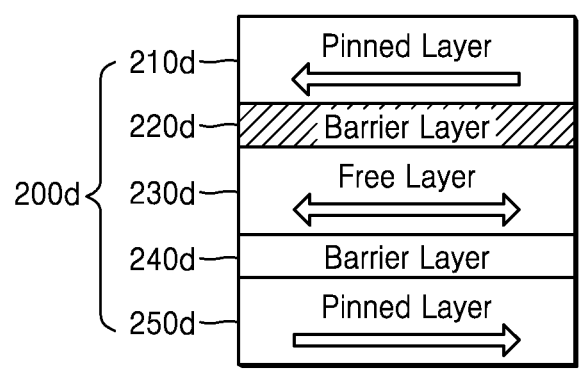
FIG. 18 is a cross-sectional view for describing a magnetoresistive device included in a resistive memory device according to example embodiments of inventive concepts.

FIG. 18 is a cross-sectional view for describing a magnetoresistive device included in the resistive memory device according to example embodiments of inventive concepts.

Referring to FIG. 18, a magnetoresistive device 200d may include a first pinned layer 210d, a first barrier layer 220d, a free layer 230d, a second barrier layer 240d, and a second pinned layer 250d. The magnetoresistive device 200d may correspond to an example embodiment of the memory cell MC of FIGS. 1 and 6.

Materials forming the first and second pinned layers 210d and 250d may be similar or substantially similar to the material forming the pinned layer 230 shown in FIG. 15, materials forming the first and second barrier layers 220d and 240d may be similar or substantially similar to the material forming the barrier layer 220 shown in FIG. 15, and a material forming the free layer 230d may be similar or substantially similar to the material forming the free layer 210 shown in FIG. 15.

When the magnetization direction of the first pinned layer 210d and the magnetization direction of the second pinned layer 250d are fixed in opposite directions, magnetic forces caused by the first and second pinned layers 210d and 250d may be offset or substantially offset. Accordingly, the magnetoresistive device 200d may perform a write operation using a relatively small amount of current. Further, the magnetoresistive device 200d may obtain a definite data value since a greater resistance is generated in the read operation by the second barrier layer 240d.

Figure 19:
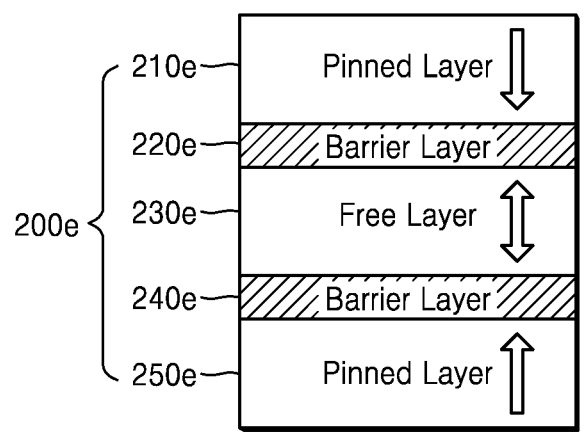
FIG. 19 is a cross-sectional view for describing a magnetoresistive device included in a resistive memory device according to example embodiments of inventive concepts.

FIG. 19 is a cross-sectional view for describing a magnetoresistive device included in the resistive memory device according to example embodiments of inventive concepts.

Referring to FIG. 19, a magnetoresistive device 200e may include a first pinned layer 210e, a first barrier layer 220e, a free layer 230e, a second barrier layer 240e, and a second pinned layer 250e. The magnetoresistive device 200e may correspond to an example embodiment of the memory cell MC of FIGS. 1 and 6.

Materials forming the first and second pinned layers 210e and 250e may be similar or substantially similar to the material forming the pinned layer 230c shown in FIG. 17, materials forming the first and second barrier layers 220e and 240e may be similar or substantially similar to the material forming the barrier layer 220c shown in FIG. 17, and a material forming the free layer 230e may be similar or substantially similar to the material forming the free layer 210c shown in FIG. 17.

In this case, when the magnetization direction of the first pinned layer 210e and the magnetization direction of the second pinned layer 250e are fixed in opposite directions, magnetic forces caused by the first and second pinned layers 210e and 250e may be offset or substantially offset. Accordingly, the magnetoresistive device 200e may perform the write operation using a relatively small amount of current.

Figure 20:
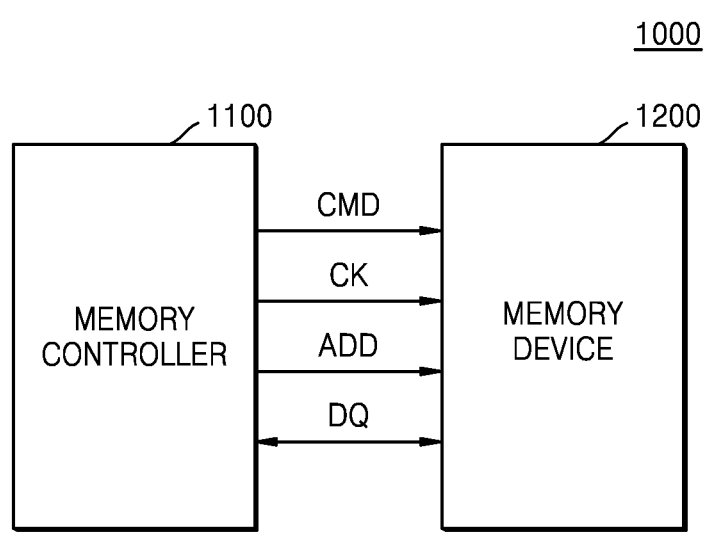
FIG. 20 is a diagram illustrating a semiconductor memory system including a resistive memory device according to example embodiments of inventive concepts.

FIG. 20 is a diagram illustrating a semiconductor memory system including the resistive memory device according to example embodiments of inventive concepts.

Referring to FIG. 20, a semiconductor memory system 1000 may include a memory controller 1100, and a memory device 1200. The memory controller 1100 may provide various kinds of signals for controlling the memory device 1200 and, for example, the signals may be a command signal CMD, a clock signal CLK, and an address signal ADD. Further, the memory controller 1100 may provide a data signal DQ to the memory device 1200 by communicating with the memory device 1200, or receive the data signal DQ from the memory device 1200.

The memory device 1200 may include the resistive memory device 100 or 100a according to example embodiments of inventive concepts described with reference to FIGS. 1 and 6.

Figure 21:
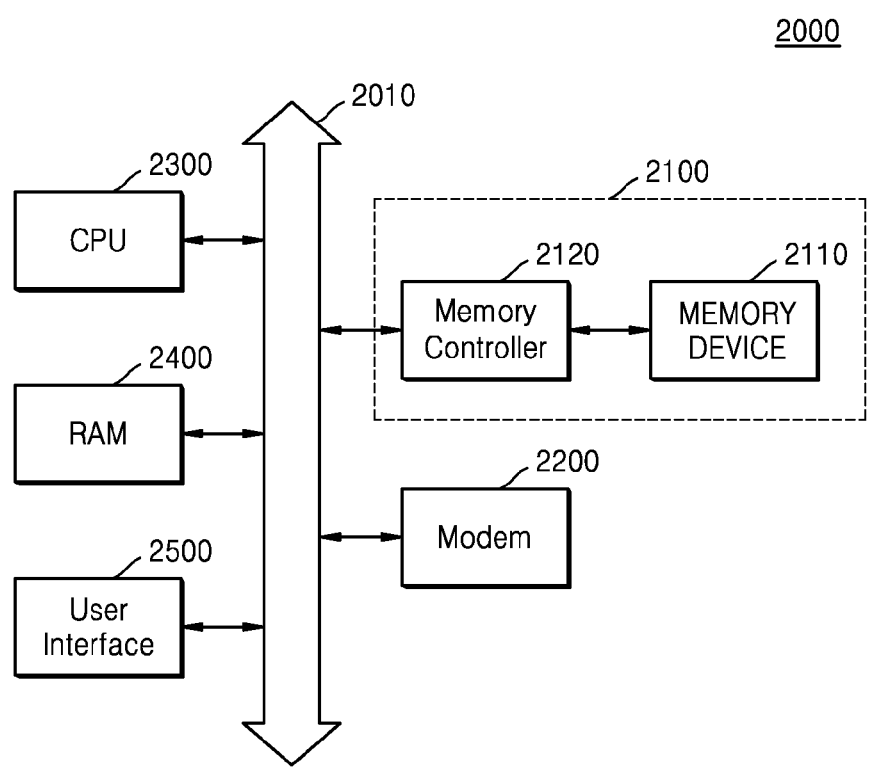
FIG. 21 is a block diagram of an information processing system including a semiconductor device including a magnetoresistive device according to example embodiments of inventive concepts.

FIG. 21 is a block diagram of an information processing system including a semiconductor device including the magnetoresistive device according to example embodiments of inventive concepts.

Referring to FIG. 21, an information processing system 2000 may include a non-volatile memory system 2100, a modem 2200, a central processing unit (CPU) 2300, a RAM 2400, and a user interface 2500, which are electrically connected to a bus 2010.

The non-volatile memory system 2100 may include a memory device 2110, and a memory controller 2120. Data processed by the CPU 2300 or data input from the outside may be written in the non-volatile memory system 2100.

At least one among the non-volatile memory system 2100, the memory device 2110, and the RAM 2400 may include the resistive memory device 100 or 100a according to example embodiments of inventive concepts described with reference to FIGS. 1 and 6.

The information processing system 2000 may be used in a portable computer (PC), a web tablet, a wireless phone, a mobile phone, a digital music player, a memory card, an MP3 player, a navigation device, a portable multimedia player (PMP), a solid state disk (SSD), household appliances, etc.

Figure 22:
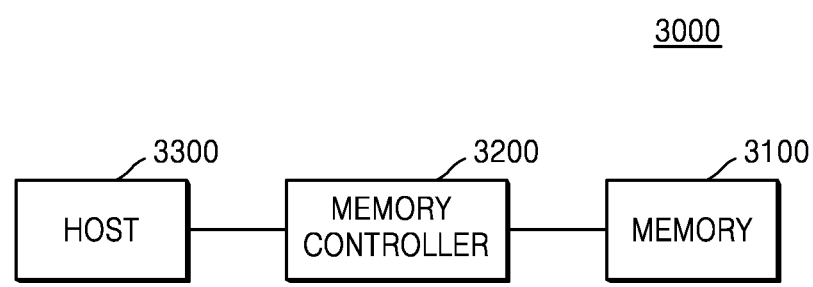
FIG. 22 is a diagram illustrating a memory card including a semiconductor device including a magnetoresistive device according to example embodiments of inventive concepts.

FIG. 22 is a diagram illustrating a memory card including a semiconductor device including a magnetoresistive device according to example embodiments of inventive concepts.

Referring to FIG. 22, a memory card 3000 may include a memory 3100 and a memory controller 3200.

The memory 3100 may store data. The memory 3100 may include the resistive memory device 100 or 100a according to example embodiments of inventive concepts described with reference to FIGS. 1 and 6.

The memory controller 3200 may read data written in the memory 3100 or write data in the memory 3100, in response to a read/write request of a host 3300.

Memory cells of resistive memory devices according to example embodiments of inventive concepts may have constant or substantially constant parasitic resistance. Accordingly, when reading the data from the memory cells, the data may be determined according to the resistance of the memory cell regardless of a deviation of a parasitic resistance component. Since a read margin may be decreased, the operating voltage of the resistive memory device may be decreased. Further, when writing the data in the memory cell, since the deviation of the parasitic resistance component may be substantially ignored, a current flowing through the memory cell may be constant or substantially constant, and distribution of the resistance of the memory cell in which the data is written may be decreased. Accordingly, the reliability of the written data may be improved and/or a lifetime of the resistive memory device may be increased. Further, since two wirings are formed in a space in which one wiring is conventionally formed, a degree of integration may be maintained.

While inventive concepts has been particularly shown and described with reference to some example embodiments thereof, it will be understood that various changes in form and details may be made therein without departing from the spirit and scope of the following claims.

What is claimed is:

1. A semiconductor device comprising:
   a bit line configured to be driven by a bit line driver;
   a source line configured to be driven by a source line driver, the source line driver adjacent to the bit line driver; and
   a plurality of memory cells connected between the bit line and the source line,
   wherein an electrical path on the bit line from each of the plurality of memory cells to the bit line driver increases as an electrical path on the source line from each of the plurality of memory cells to the source line driver decreases.

2. The semiconductor device of claim 1, wherein
   the bit line includes a first bit wiring and a second bit wiring, the plurality of memory cells connected to the first bit wiring, and the second bit wiring connecting the first bit wiring to the bit line driver; and
   the plurality of memory cells are connected to the bit line driver through the first bit wiring and the second bit wiring.

3. The semiconductor device of claim 2, wherein
   the second bit wiring is on the first bit wiring; and
   the second bit wiring is connected to the first bit wiring through a contact plug.

4. The semiconductor device of claim 2, wherein
   the second bit wiring is connected to the bit line driver at a first end of the second bit wiring; and
   the second bit wiring is connected to the first bit wiring at a position adjacent to a second end of the second bit wiring, the second end located at an opposite side of the second bit wiring relative to the first end.

5. The semiconductor device of claim 2, wherein
   the plurality of memory cells include a first memory cell and a second memory cell, the second memory cell located physically closer to the bit line driver and the source line driver than the first memory cell; and
   the first memory cell is closer to a connection point of the first bit wiring and the second bit wiring than the second memory cell.

6. The semiconductor device of claim 1, wherein
   the source line includes
   a first source wiring to which the plurality of memory cells are connected, and
   a second source wiring connecting the first source wiring to the source line driver; and
   the plurality of memory cells are connected to the source line driver through the first source wiring and the second source wiring.

7. The semiconductor device of claim 6, wherein the second source wiring is on the first source wiring and connected to the first source wiring through a contact plug.

8. The semiconductor device of claim 1, wherein
   the plurality of memory cells include a first memory cell and a second memory cell spaced apart from each other; and
   when an electrical path on the source line between the first memory cell and the source line driver is longer than an electrical path on the source line between the second memory cell and the source line driver, an electrical path on the bit line between the first memory cell and the bit line driver is shorter than an electrical path on the bit line between the second memory cell and the bit line driver.

9. The semiconductor device of claim 1, wherein each of the plurality of memory cells comprises:
   a magnetoresistive device having a magnetic tunnel junction (MTJ) structure.

10. The semiconductor device of claim 1, wherein each of the plurality of memory cells comprises:

a phase change material layer configured to transition into a crystalline state or an amorphous state according to a current flowing between the bit line and the source line.

11. The semiconductor device of claim 1, wherein each of the plurality of memory cells comprises:
a variable resistance layer in which an electrical resistance varies with oxygen vacancy or oxygen movement.

12. A semiconductor device comprising:
a bit line extending in a first direction;
a source line extending in the first direction;
a sub-line connected to a first line, the first line being one of the bit line and the source line, the sub-line extending in the first direction; and
a plurality of memory cells connected between the sub-line and a second line, the plurality of memory cells spaced apart from each other along the first direction, the second line being another of the bit line and the source line, wherein
for a current flow from the bit line to the source line through a memory cell among the plurality of memory cells,
a direction of current configured to flow through the sub-line is opposite to a direction of current configured to flow through the first line, and
a direction of the current configured to flow through the sub-line is the same as a direction of a current configured to flow through the second line.

13. The semiconductor device of claim 12, further comprising:
a bit line driver connected to the bit line, the bit line driver configured to drive the bit line;
a source line driver connected to the source line, the source line driver configured to drive the source line;
a plurality of switching devices connected between the plurality of memory cells and the source line; and
a plurality of word lines extending in a second direction, the plurality of word lines configured to control the plurality of switching devices, and the second direction different from the first direction, wherein
the bit line driver and the source line driver at the same side of the plurality of memory cells.

14. The semiconductor device of claim 13, wherein each of the plurality of memory cells has a magnetic tunnel junction (MTJ) structure.

15. A semiconductor device comprising:
a plurality of memory cells arranged in a row or column of a memory cell array;
a first wiring line structure including a first wiring line and a sub line connected at a first end of the first wiring line structure, the sub line also connected to a first end of each of the plurality memory cells;
a second wiring line connected to a second end of each of the plurality of memory cells; and
a driver circuit connected to the first wiring line and the second wiring line at a second end of the first wiring line structure, the driver circuit configured to perform a memory operation on the plurality of memory cells; wherein
the first wiring line structure is one of a bit line and a source line; and
the second wiring line is another of the bit line and the source line.

16. The semiconductor device of claim 15, wherein the first wiring line structure, the second wiring line, and the plurality of memory cells are configured such that a length of an electrical path for the memory operation performed on each of the plurality of memory cells is substantially the same.

17. The semiconductor device of claim 15, further comprising:
a plurality of word lines arranged to cross the first wiring line structure and the second wiring line, each of the plurality of word lines connected to a corresponding memory cell among the plurality of memory cells.

18. The semiconductor device of claim 15, wherein
the plurality of memory cells includes a first memory cell and a second memory cell; and
a sum of an electrical path length between the driver circuit and the first memory cell through the first wiring line structure and an electrical path length between the first memory cell and the driver circuit through the second wiring line is substantially the same as a sum of an electrical path length between the driver circuit and the second memory cell through the first wiring line structure and an electrical path length between the second memory cell and the driver circuit through the second wiring line.

19. The semiconductor device of claim 15, wherein at least one of the plurality of memory cells comprises one of:
a magnetoresistive device having a magnetic tunnel junction (MTJ) structure;
a phase change material layer configured to transition into a crystalline state or an amorphous state according to a current flowing through the at least one memory cell; and
a variable resistance layer in which an electrical resistance varies with oxygen vacancy or oxygen movement.

* * * * *